United States Patent
Tanaka et al.

(10) Patent No.: US 7,716,628 B2
(45) Date of Patent: May 11, 2010

(54) SYSTEM, METHOD AND PROGRAM FOR GENERATING MASK DATA, EXPOSURE MASK AND SEMICONDUCTOR DEVICE IN CONSIDERATION OF OPTICAL PROXIMITY EFFECTS

(75) Inventors: Satoshi Tanaka, Kawasaki (JP); Kazuya Fukuhara, Tokyo (JP); Toshiya Kotani, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/298,840

(22) Filed: Dec. 12, 2005

(65) Prior Publication Data

US 2006/0129967 A1 Jun. 15, 2006

(30) Foreign Application Priority Data

Dec. 13, 2004 (JP) ............................ P2004-360210

(51) Int. Cl.
*G06F 17/50* (2006.01)
(52) U.S. Cl. .............................. 716/21; 716/19; 716/20; 430/30
(58) Field of Classification Search .................... 716/8, 716/19–21; 382/144; 257/48; 430/5, 30
See application file for complete search history.

(56) References Cited

U.S. PATENT DOCUMENTS

| | | | | |
|---|---|---|---|---|
| 5,867,253 A | * | 2/1999 | Nakae | 355/52 |
| 5,933,212 A | * | 8/1999 | Kasuga | 355/20 |
| 6,137,901 A | * | 10/2000 | Harazaki | 382/144 |
| 6,180,293 B1 | | 1/2001 | Tanaka et al. | |
| 6,335,981 B1 | * | 1/2002 | Harazaki | 382/144 |
| 6,374,396 B1 | * | 4/2002 | Baggenstoss et al. | 716/19 |
| 6,453,274 B2 | * | 9/2002 | Kamon | 703/2 |
| 6,567,964 B2 | * | 5/2003 | Shin et al. | 716/8 |
| 6,850,854 B2 | * | 2/2005 | Naya et al. | 702/81 |
| 7,049,609 B2 | * | 5/2006 | Takehana | 250/492.22 |
| 2001/0053964 A1 | * | 12/2001 | Kamon | 703/2 |
| 2002/0113234 A1 | * | 8/2002 | Okuda et al. | 257/48 |
| 2003/0026472 A1 | * | 2/2003 | Abe | 382/144 |
| 2003/0074646 A1 | * | 4/2003 | Kotani et al. | 716/19 |
| 2003/0093767 A1 | * | 5/2003 | Murai et al. | 716/21 |

FOREIGN PATENT DOCUMENTS

JP 11-102062 4/1999

OTHER PUBLICATIONS

Fukuhara et al., Method for Evaluating a Local Flare, Correction Method for a Mask Pattern, Manufacturing Method for a Semiconductor Device and a Computer Program Product, U.S. Appl. No. 11/136,404, filed May 25, 2005.

\* cited by examiner

*Primary Examiner*—Paul Dinh
*Assistant Examiner*—Nha T Nguyen
(74) *Attorney, Agent, or Firm*—Finnegan, Henderson, Farabow, Garrett & Dunner, L.L.P.

(57) ABSTRACT

A system for generating mask data includes an extracting module extracting a block necessary to correct process proximity effects as a wide correction area from a plurality of blocks by comparing parameter, a wide correction data generator generating wide correction data to make the correction applied to the wide correction area, and a mask data generator generating mask data by applying the wide correction data to the wide correction area.

15 Claims, 17 Drawing Sheets

FIG. 7A    FIG. 7B    FIG. 7C
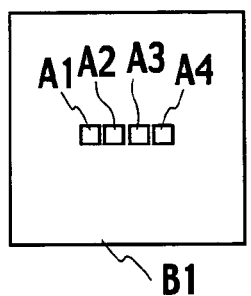
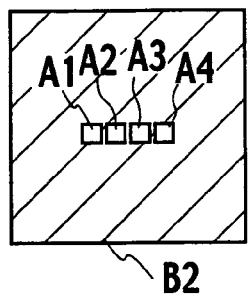
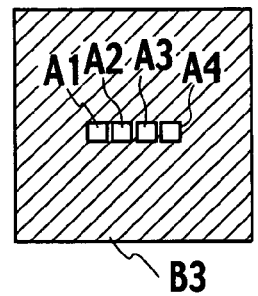
FIG. 8
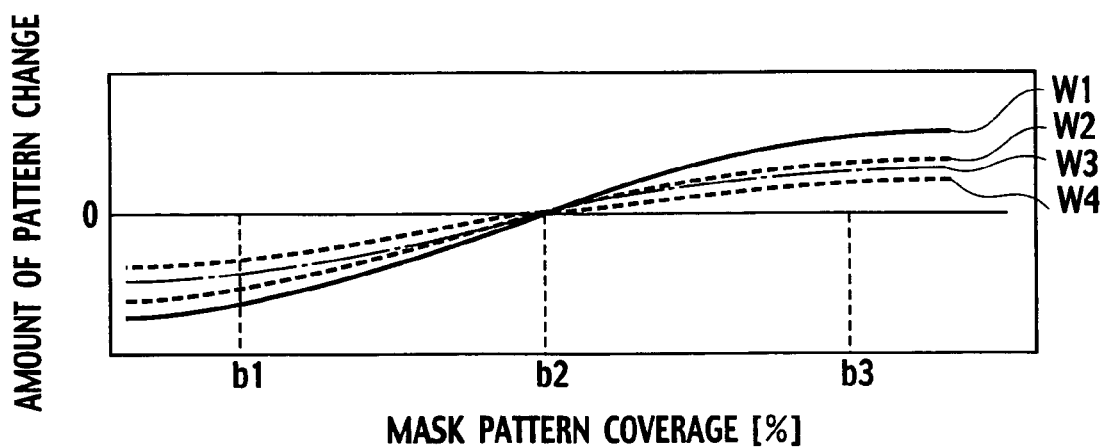

FIG. 15

| BLOCK | PARAMETER | | | | |
|---|---|---|---|---|---|
| $U_{11}$ | $\alpha_{11}$ | $\beta_{11}$ | $\varepsilon_{11}$ | $\delta_{11}$ | ----- |
| ⋮ | ⋮ | ⋮ | ⋮ | ⋮ | ----- |
| $U_{mn}$ | $\alpha_{mn}$ | $\beta_{mn}$ | $\varepsilon_{mn}$ | $\delta_{mn}$ | ----- |

FIG. 16

| | | | | $U_{55}$ |
|---|---|---|---|---|
| 0.3 | 0.2 | 0.3 | 0.4 | 0.2 |
| 0.6 | 0.5 | 0.4 | 0.2 | 0.3 |
| 0.2 | 0.3 | 0.4 | 0.5 | 0.6 |
| 0.7 | 0.3 | 0.2 | 0.3 | 0.4 |
| 0.2 | 0.4 | 0.5 | 0.6 | 0.3 |

$U_{11}$

SYSTEM, METHOD AND PROGRAM FOR GENERATING MASK DATA, EXPOSURE MASK AND SEMICONDUCTOR DEVICE IN CONSIDERATION OF OPTICAL PROXIMITY EFFECTS

CROSS REFERENCE TO RELATED APPLICATIONS AND INCORPORATION BY REFERENCE

This application is based upon and claims the benefit of priority from prior Japanese Patent Application P2004-360210 filed on Dec. 13, 2004; the entire contents of which are incorporated by reference herein.

BACKGROUND OF THE INVENTION

1. Field of the Invention

The present invention relates to technology for making mask data, and particularly to a system, a method and a program for generating mask data, exposure mask and semiconductor device in consideration of optical proximity effects 2. Description of the Related Art With the miniaturization of a large scale integrated circuit (LSI), an LSI having a minimum line width equal to or shorter than a half of the wavelength of a light source of exposure equipment is required. Due to the miniaturization of such an LSI, a problem arises because of optical proximity effects (OPE) where a pattern with a desired shape cannot be transferred onto a wafer due to the influence of an adjacent pattern on the image of a mask pattern projected on the wafer. Hereinafter, the amount of change in shape of an actual pattern formed on the wafer, as compared to the desired pattern, is referred to as a "pattern change amount".

Optical proximity correction (OPC) has recently been made where a correction of a mask pattern is made in consideration of the optical proximity effects in the photolithography process. Also, process proximity correction (PPC) has been made where correction of a mask pattern is made in consideration of the proximity effects in the etching process and the like in addition to the optical proximity effects. For example, the following method for generating mask pattern correction data has been proposed. The method includes forming a pattern on a wafer by applying an appropriate mask pattern to a process used in the manufacture of a semiconductor device; generating a prediction model of a pattern in consideration of the pattern change amount by measuring the shape and dimension of the formed pattern; predicting the finished shape of a circuit pattern of a semiconductor device with the prediction model; and generating mask pattern correction data based on the predicted finished shape.

When generating the prediction model, it is required to set an area, including patterns influencing each other, on the dimension or shape of a prediction target pattern. Then, the set area is assumed to be a reference area, and the mask pattern is corrected based on the prediction model included in the reference area. The "reference area" is an area for referring to the mask pattern correction data centering on a focused point in order to determine the correction amount to be applied in the process proximity correction centering on the focused point of a given pattern. In general, the reference area is often set in a manner by including a plurality of patterns exercising optical influence on each other, and the size of the reference area is set within two microns.

However, due to the influence of the pattern density in the surroundings, a phenomenon that the pattern change amount in an area where the process proximity correction is made is different is often observed. This phenomenon is, for example, termed "stray light" or "flare", which is generated by non-uniformity of optical elements and the like used for an optical system of an exposure system, or by a deviation from a desired shape. Alternatively, the phenomenon is referred to as loading effects produced in the resist development process or the etching process. Here, the above-mentioned phenomenon is hereinafter described as a "flare" phenomenon. The "pattern density" (or "pattern density") is a value found in a manner such that the space for a pattern in a given area is divided by the space of the given area. The pattern density in the mask pattern is referred to as the "mask pattern density". There is a case where the reference area is set to include surrounding areas which are a cause of the flare phenomenon and where the prediction model is generated. The space of the reference area becomes large due to consideration of the flare phenomenon.

In the LSI including a memory such as a random access memory (RAM), the same design pattern is repeatedly used. Therefore, design data, which is compressed while the same design pattern is divided into the graphic and arrangement information, often has a layered structure. When the space of the reference area is increased, there is a case where all design data of a RAM and the like are included in one reference area in an LSI including a memory. In such case, the memory cell patterns in the central portion of a memory cell array and in the peripheral portion of the memory cell array may have a differently influenced by the process proximity effects due to the difference in respective pattern density, even if they are the same memory cell patterns. Hence, it is not possible to apply the same correction amounts to all memory cell patterns. Thus, after developing the layered structure of the design data (hereinafter, referred to as a "flattening of design data"), a process proximity correction for each memory cell pattern is required. Therefore, if the process proximity correction in which a wide reference area is set in consideration of the flare phenomenon, the amount of mask data after the process proximity correction increases due to the flattening of the design data, and thus the time required for the process proximity correction increases.

As a method of the process proximity correction in consideration of problems following the flattening of the design data, there is a method in which the process proximity correction is first made in a small reference area and the process proximity correction is added in the electron beam exposure process together with an electron beam irradiation amount correction.

However, since the process proximity correction is made together with the electron beam irradiation amount correction, as performed in electron beam equipment in the above-mentioned method, it is difficult to check the process proximity amount correction applied to a manufactured semiconductor device. The check referred to here is to check whether or not a circuit pattern of a semiconductor device manufactured by use of a generated mask pattern based on an applied correction amount or correction shape is completed as desired, by using design data, post-correction mask pattern data and a prediction model. Furthermore, the above-mentioned check is to check whether or not the circuit pattern can be formed in a range of a predetermined dimension change amount, or whether or not the circuit pattern can be formed in a range of a predetermined dimension change amount under tolerable process changes (for example, an exposure amount change, a focus change, a mask pattern dimension change, a resist sensitivity change, a development time, a temperature change, an etching condition change, and the like).

Moreover, if the correction target area of the electron beam irradiation amount correction fails to agree with the reference area of the process proximity correction, the accuracy of the process proximity correction is not sufficient. There is a known case where an area of several microns to several hundred microns is required as the reference area of the process proximity correction, while a common electron beam irradiation correction target area is of several tens of microns at a dimension on a mask.

SUMMARY OF THE INVENTION

An aspect of the present invention inheres in a system for generating mask data. The system includes an extracting module configured to extract a block necessary to correct process proximity effects as a wide correction area from a plurality of blocks by comparing parameter, which influences process proximity effects, of each mask pattern in the blocks with an extraction condition, design data being divided into the plurality of blocks on a chip area and to; a wide correction data generator configured to generate wide correction data to make the correction applied to the wide correction area; and a mask data generator configured to generate mask data by applying the wide correction data to the wide correction area.

Another aspect of the present invention inheres in a computer implemented method for generating mask data. The method includes dividing design data into a plurality of blocks on a chip area; extracting a block necessary to correct process proximity effects as a wide correction area from the plurality of blocks by comparing parameter, which influences the process proximity effects, of each mask pattern in the blocks with an extraction condition; generating wide correction data to make the correction applied to the wide correction area; and generating mask data by applying the wide correction data to the wide correction area.

Still another aspect of the present invention inheres in an exposure mask produced with mask data. The mask data being generated by a method including dividing design data into a plurality of blocks on a chip area; extracting a block necessary to correct process proximity effects as a wide correction area from the plurality of blocks by comparing parameter, which influences the process proximity effects, of each mask pattern in the blocks with an extraction condition; generating wide correction data to make the correction applied to the wide correction area; and applying the wide correction data to the wide correction area.

Still another aspect of the present invention inheres in a method including a photolithography process using an exposure mask for manufacturing a semiconductor device. The method includes dividing design data into a plurality of blocks on a chip area, extracting a block necessary to correct process proximity effects as a wide correction area from the plurality of blocks by comparing parameter, which influences the process proximity effects, of each mask pattern in the blocks with an extraction condition, generating wide correction data to make the correction applied to the wide correction area, generating mask data by applying the wide correction data to the wide correction area; and producing the exposure mask based on the mask data.

Further, still another aspect of the present invention inheres in a computer program product to be executed by a computer for generating mask data. The program includes instructions configured to divide design data into a plurality of blocks on a chip area; instructions configured to extract a block necessary to correct process proximity effects as a wide correction area from the plurality of blocks by comparing parameter, which influences process proximity effects, of each mask pattern in the blocks with an extraction condition; instructions configured to generate wide correction data to make the correction applied to the wide correction area; and instructions configured to generate mask data by applying the wide correction data to the wide correction area.

BRIEF DESCRIPTION OF THE DRAWINGS

FIGS. 7A through 7C show exemplary mask pattern areas to explain mask pattern density and a pattern change amount;

FIG. 8 is a graph showing relation between mask pattern density and a pattern change amount;

FIG. 15 shows a table of exemplary parameter of the blocks shown in FIG. 14;

FIG. 16 shows an example of mask pattern density of blocks shown in FIG. 14;

DETAILED DESCRIPTION OF THE INVENTION

Figure 1:
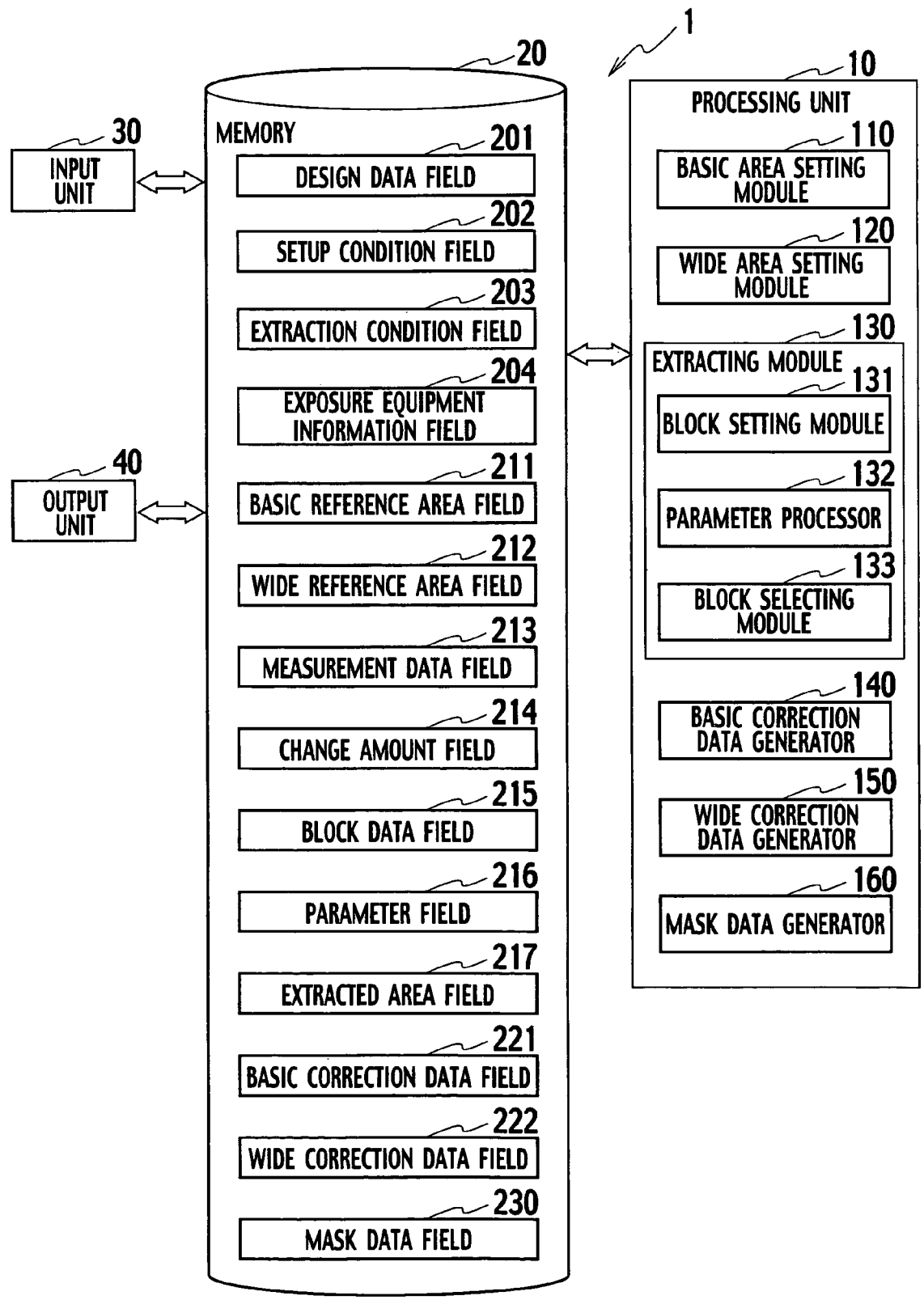
FIG. 1 shows a schematic structure of a system for generating mask data according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

A system for generating mask data according to an embodiment of the present invention includes a processing unit 10, a memory 20, an input unit 30 and an output unit 40 as shown in FIG. 1. The processing unit 10 includes an extracting module 130, a wide correction data generator 150 and a mask data generator 160. The extracting module 130 divides design data into a plurality of blocks on a chip area, and extracts a block necessary to correct the process proximity effects as a wide correction area, from the plurality of blocks, by comparing, with an extraction condition, parameters which influence the process proximity effects of each mask pattern in the block. The wide correction data generator 150 generates wide correction data for correcting the process proximity effects applied to the wide correction area. The mask data generator 160 generates mask data by applying the wide correction data to the wide correction area.

Hereinafter, process proximity effects in which a range where the influence range of the process proximity effects is wider than that of a basic reference area, due to the mask pattern density of the design data and the like, is referred to as "wide-range process proximity effects". The "wide correction area" is extracted from the design data as an area necessary to make the process proximity correction in consideration of the wide-range process proximity effects. A reference area in the case where the wide-range process proximity correction applied to the wide correction area is made is referred to as a "wide reference area".

The processing unit 10 further includes a basic area setting module 110, a wide area setting module 120 and a basic correction data generator 140. The basic area setting module 110 sets a basic reference area by including a plurality of patterns which exercise an optical influence on each other. The wide area setting module 120 sets the size of a wide reference area in a chip area based on a range of the wide-range process proximity effects. The basic correction data generator 140 makes the process proximity correction on the design data with reference to basic mask pattern correction data calculated in consideration of the process proximity effects in the basic reference area, thus generating basic correction data.

The extracting module 130 includes a block setting module 131 for dividing design data into the plurality of blocks, a parameter processor 132 for calculating the parameter value of a block, and a block selecting module 133 for extracting a block based on the parameter value.

The memory 20 includes a design data field 201 for storing the design data, a setup condition field 202 for storing a reference value to set a reference area, an extraction condition field 203 for storing a condition on the extraction of the wide correction area, and an exposure equipment information field 204 for storing information of the exposure equipment. Additionally, the memory 20 includes a basic reference area field 211 for storing the information of the basic reference area, a wide reference area field 212 for storing the information of the wide reference area, a measurement data field 213 for storing measured data, a change amount field 214 for storing a pattern change amount, a block data field 215 for storing the information of a block, a parameter field 216 for storing the parameters of a block, and an extracted area field 217 for storing the information of the wide correction area. Furthermore, the memory 20 includes a basic correction data field 221 for storing basic correction data, a wide correction data field 222 for storing wide correction data, and a mask data field 230 for storing mask data.

The input unit 30 includes a keyboard, a mouse pointer, a light pen, and a flexible disk unit or other equivalent elements. A person responsible for generating mask data uses the input unit 30 to specify design data and an extraction condition. The output unit 40 includes a display and a printer, which display the mask data, or a recording unit, which stores information in a computer readable recording medium. A 'computer readable recording medium' refers to a medium such as an external storage unit for a computer, a semiconductor memory, a magnetic disk, or an optical disk, which may store electronic data. More specifically, a 'computer readable recording medium' may be a flexible disk, a compact disk read only memory (CD-ROM), or a magneto-optics (MO) disk.

(Basic Reference Area Setting Method)

Figure 2:
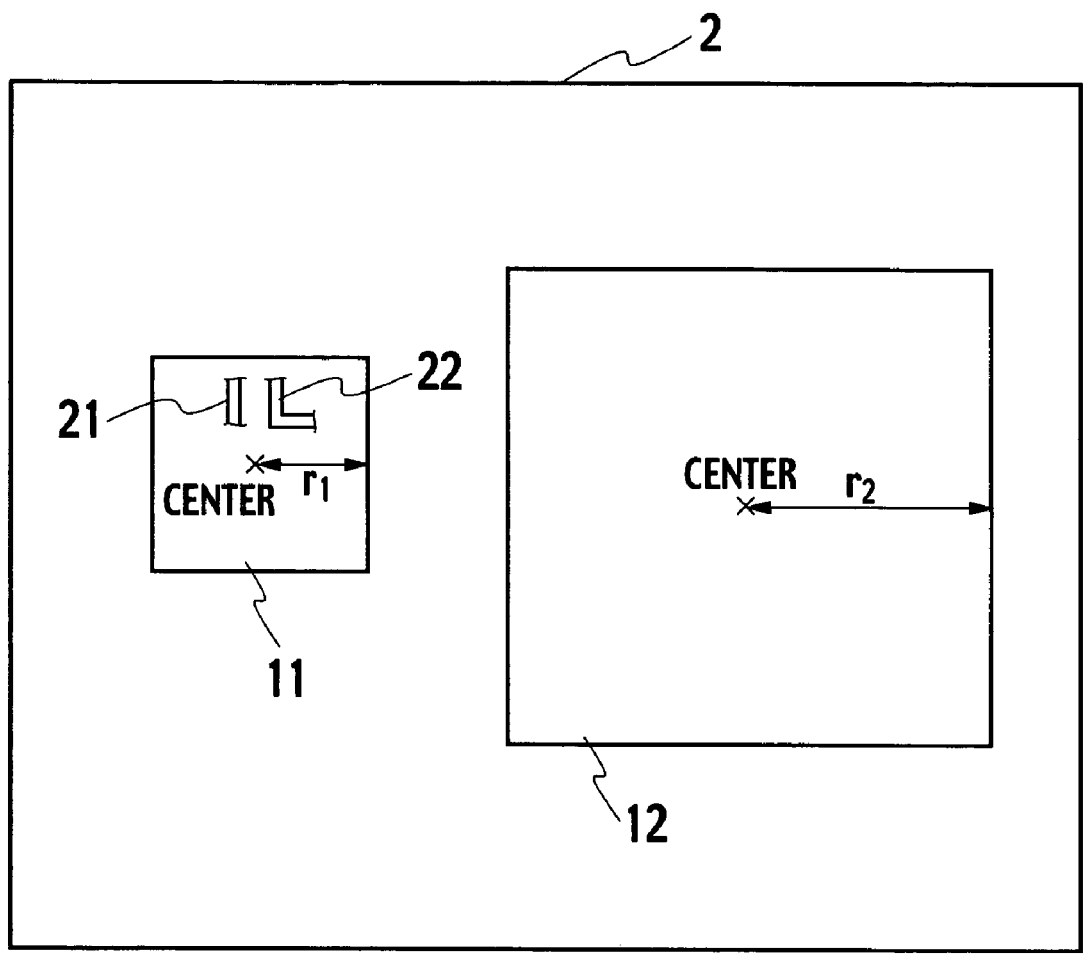
FIG. 2 shows a top view of a chip area to explain a reference area to be set by a system for generating mask data according to an embodiment of the present invention.

When patterns 21 and 22 disposed on a chip area 2 exercise optical influence on each other, a basic reference area 11, shown in FIG. 2, is set to include the patterns 21 and 22. A distance between the patterns which exercise optical influence on each other, that is, a distance of the optical proximity effects depends on processing conditions such as an exposure and processing, which are applied in the manufacturing process when manufacturing a semiconductor device based on the design data. Therefore, the reference area 11 is set so that a minimum distance r1, shown in FIG. 2, from the center of the basic reference area 11 to the outer circumference of the basic reference area 11 (hereinafter, referred to as a "basic reference distance") is equal to or longer than a minimum distance where the optical proximity effects, to be decided according to the processing conditions, do not reach. Especially, a range in which the proximity effects between adjacent patterns reach relates to a degree of spatial coherence on an exposure mask. The degree of spatial coherence $\gamma_{ij}$ is generally shown by expression (1) as a mutual intensity function of light intensity of different spatial points i and j:

$$\gamma_{ij} = \Gamma_{ij}/(\Gamma_{ii}+\Gamma_{jj}) \tag{1}$$

Here, $\Gamma_{ij}$ is a mutual intensity of the spatial points i and j, and is shown as expression (2):

$$\Gamma_{ij} = \int E_i(t) E^*_j(t) dt \tag{2}$$

In expression (2), Ei indicates the amplitude of the light at point i, E*j indicates a complex conjugate of the amplitude of the light at point j, and ∫dt indicates a time integration. When the degree of spatial coherence $\gamma_{ij}$ is small enough, the optical proximity effects are not produced between two points on the chip area corresponding to points i and j on the exposure mask surface.

As above described, when the space of the basic reference area 11 is large, there is a possibility that the amount of mask data increases due to the flattening of design data. Therefore, it is desired that the space of the basic reference area 11 is as small as possible. Hence, the basic reference area 11 is set, for example, as a minimum distance in which the degree of spatial coherence $\gamma_{ij}$ is small and the optical proximity effects do not occur.

Since the degree of spatial coherence $\gamma_{ij}$ depends on the optical conditions of exposure equipment, a description will be given of exposure equipment 6 shown in FIG. 3. The i-line of a mercury lamp (center wavelength 365 nm), a krypton fluoride (KrF) excimer laser beam (center wavelength 248 nm), an argon fluoride (ArF) excimer laser beam (center wavelength 193 nm), and the like are usable as an exposure light source 60 of the exposure equipment 6. The beam emitted from the exposure light source 60 is formed by a σ aperture 63 after passing through a light source spatial distribution equalization element 61 and a first lens 62. As the shape of the aperture, any one of a circular aperture, a ring aperture, a lattice shape and the like is selected according to the size of a transfer pattern and the like. The beam formed by the a aperture 63 passes a second lens 64 as an effective light source, and projects a mask pattern of an exposure mask 65 onto a wafer 7 through a projection optical system 66 having a third lens 661, a NA aperture 662 and a fourth lens 663. A photoresist film, of which illustration is omitted, is applied to the wafer 7. For example, in a case of a positive-type photoresist film, a part exposed to light becomes soluble. A photoresist film in the part which became soluble is removed in the development process. In addition, a semiconductor device is manufactured by use of a photoresist film after the development process as a mask, after a process of etching a film subject to processing on the wafer 7, a process of implanting ions such as boron (B) and phosphorus (P) into a film subject to processing, and the like. The size of the effective light source projected on a pupil positioned at the NA aperture 662, where the size of a numerical aperture is one, is generally referred to as a "coherence factor".

Next, a description will be given of an example of a method for setting a basic reference distance r1 shown in FIG. 2 when a semiconductor device is manufactured by use of the exposure equipment 6. Hereinafter, a description will be given of a method for setting the basic reference distance r1 with the degree of spatial coherence $\gamma_{ij}$ shown in expression (1) by use of the system 1 for generating mask data, the system being shown in FIG. 1, with reference to a flowchart of FIG. 4.

Figure 3:
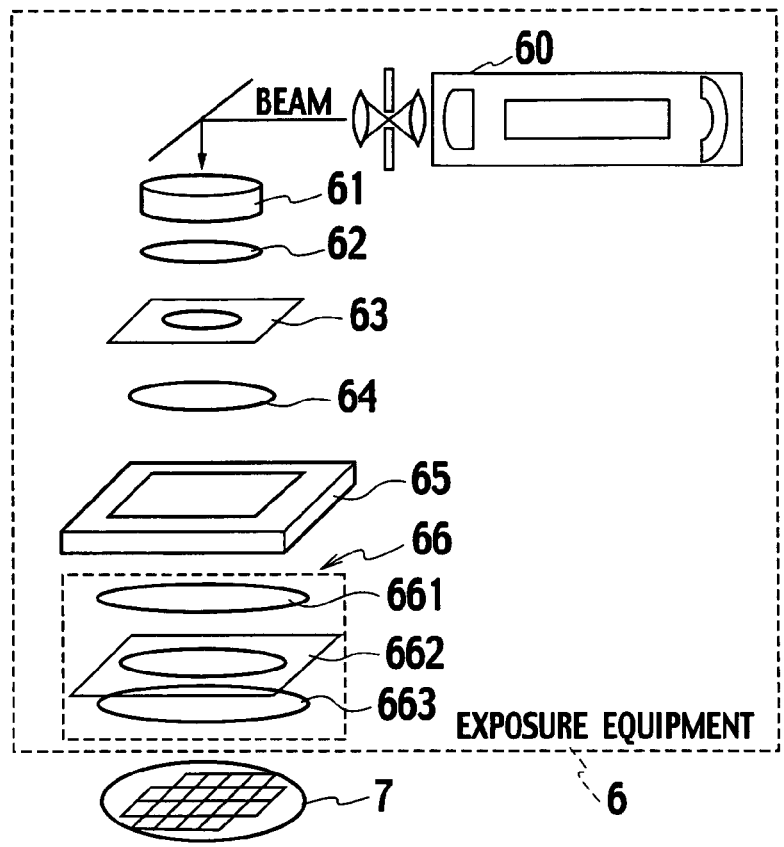
FIG. 3 shows a schematic structure of exposure equipment.

In Step S11, information including the center wavelength λ of the exposure light source 60 of the exposure equipment 6 shown in FIG. 3, the numerical aperture NA of the projection optical system 66, and coherence factor σ is stored in the exposure equipment information field 204 through the input unit 30 shown in FIG. 1. Note that the information of the exposure equipment 6 may be previously stored in the exposure equipment information field 204.

In Step S12, the basic area setting module 110 reads the information of the exposure equipment 6, which is stored in the exposure equipment information field 204. Then, the basic area setting module 110 calculates the degree of spatial coherence $\gamma_{ij}$ on the exposure mask surface with reference to the information of the exposure equipment 6. The degree of spatial coherence $\gamma_{ij}$ is shown with Fourier transform of the light source intensity distribution from the van Cittert-Zernike theorem. Therefore, the degree of spatial coherence $\gamma_{ij}$ can be found with expression (3) shown below:

$$\gamma_{ij}=2\times J_1(2\Pi r\sigma NA/\lambda)/\{2\Pi(\sigma rNA/\lambda)\} \quad (3)$$

Figure 5:
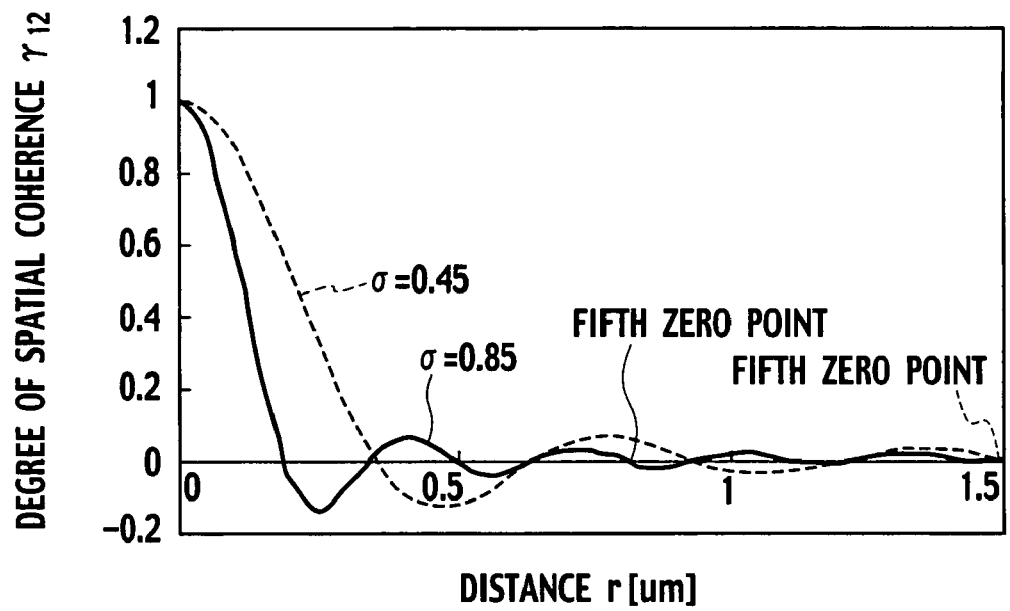
FIG. 5 is a graph showing degree of spatial coherence.

In expression (3), r is the distance between the two points i and j on the exposure mask surface. Moreover, $J_1$ is a Bessel function of the first kind. FIG. 5 shows an example of the degree of spatial coherence $\gamma_{ij}$ calculated by use of expression (2).

In Step S13, the basic area setting module 110 sets the basic reference distance r1 by use of the degree of spatial coherence $\gamma_{ij}$. Assuming a projection power M of the exposure equipment 6, the light source shape of the projection optical system 66 is σ/M. However, in the calculation of the degree of spatial coherence $\gamma_{ij}$, as an optical system at the ratio of 1:1 of the pattern dimensions on the mask surface and on the wafer, the coherence factor σ can be used as it is. Then, if a distance r between the two points i and j on the exposure mask surface is equal to or longer than the basic reference distance r1, then the beams from the two points i and j reaching the exposure mask surface fail to influence each other on the wafer. In terms of a point where the degree of spatial coherence $\gamma_{ij}$ shown in FIG. 5 is almost stable at zero, it is possible to set the distance r to a fifth zero point as the basic reference distance r1, for example. In that case, when the coherence factor σ is 0.85, the basic reference distance r1 can be set to approximately 0.8 μm. When the coherence factor σ is 0.45, the basic reference distance r1 can be set to approximately 1.5 μm. The information of the set basic reference distance r1 and the basic reference area 11, determined by the basic reference distance r1, is stored in the basic reference area field 211.

(Wide Reference Area Setting Method)

Figure 6A:
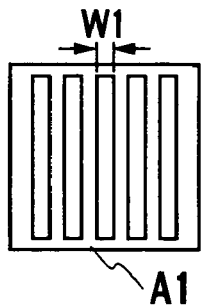
FIGS. 6A through 6D show exemplary mask patterns to explain mask pattern density and a pattern change amount.
Figure 6B:
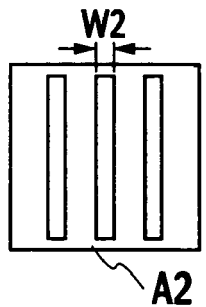
Figure 6C:
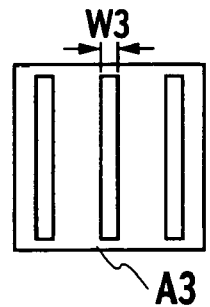
Figure 6D:
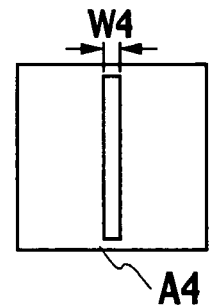

Next, a description will be given of the setup of the wide reference area. Here, consideration is given to the pattern change amounts in a mask pattern area A1 in which five mask patterns, respectively, with a width W1 shown in FIG. 6A are arranged, a mask pattern area A2 in which three mask patterns, respectively, with a width W2 shown in FIG. 6B are arranged, a mask pattern area A3 in which three mask patterns respectively with a width W3 shown in FIG. 6C are arranged, and a mask pattern area A4 in which one mask pattern with a width W4 shown in FIG. 6D is arranged. The widths W1 to W4 are the widths of patterns formed on the wafer. The external shapes of the mask pattern areas A1 to A4 are the same shapes as the basic reference area 11 shown in FIG. 2. As shown in FIGS. 7A to 7C, sets of the mask pattern areas A1 to A4 are arranged, respectively, at the centers of mask pattern areas B1 to B3 with mask pattern density b1 to b3. The mask pattern density b1 to b3 are b1<b2<b3. As shown in FIG. 8, each pattern change amount of the mask patterns with the widths W1, W2, W3 and W4 depends on the mask pattern density b1 to b3 around the mask pattern areas A1 to A4. The higher the mask pattern density around the mask pattern areas A1 to A4, the larger the pattern change amounts. In FIG. 8, the pattern change amounts are shown, assuming that the pattern change amounts of the mask patterns having the widths W1, W2, W3 and W4 are zero at the mask pattern density b2.

Therefore, it is required to correct the process proximity effects on the mask patterns having the widths W1, W2, W3 and W4 in consideration of the influence of the mask pattern density around the mask pattern areas A1 to A4. Since the mask pattern areas A1 to A4 are the same shapes as the basic reference area 11, it is required to correct the process proximity effects while setting the wide reference area 12 which has a larger space than a space of the basic reference area 11.

The distance in which the influence of the mask pattern density (or density) extends depends on the optical and processing conditions of exposure equipment for manufacturing a semiconductor device. For example, the following method may be used for setting the size of the wide reference area 12. An exposure mask having a plurality of areas in which mask pattern density differs respectively is produced. The shape data of a semiconductor device manufactured by use of the produced exposure mask is acquired. Thus, it is possible to set the wide reference area 12 in consideration of the wide-range process proximity effects, based on a relation between the pattern change amount calculated from the acquired shape data and the mask pattern density.

Hereinafter, a description will be given of a method for setting the wide reference area with the system 1 for generating mask data shown in FIG. 1 by use of the mask pattern area A1 shown in FIG. 6A and design data D1 to D6 shown, respectively, in FIGS. 11A to 11F.

Firstly, a description will be given of the design data D1 to D6. The mask pattern area A1 is arranged at the center of each of the design data D1 to D6. In the design data D1, the mask pattern density of an area, whose external shape is rectangular, around the mask pattern area A1 arranged at the center of the design data D1 is d1. The shape of the area of the design data D1 with the mask pattern density d1 is similar to the shape of the mask pattern area A1. In the design data D1, the mask pattern density of an area, whose external shape shown with diagonal lines is rectangular, around the area with the mask pattern density d1 is d2. The mask pattern density d1 is smaller than the mask pattern density d2. A minimum distance from the center of the design data D1 to a point where the mask pattern density d1 changes to the mask pattern density d2 is Rd1. A minimum distance from the center of the design data D1 to the outer circumference of the area with the pattern density d2 is Rd3.

In the design data D2, the mask pattern density of an area, whose external shape is rectangular, around the mask pattern area A1 arranged at the center of the design data D2 is d1. The shape of the area of the design data D2 with the mask pattern density d1 is similar to the shape of the mask pattern area A1. In the design data D2, the mask pattern density of an area, whose external shape shown with diagonal lines is rectangular, around the area with the mask pattern density d1 is d2. A minimum distance from the center of the design data D2 to a point where the mask pattern density d1 changes to the mask pattern density d2 is Rd2. The distance Rd1 is smaller than the distance Rd2. A minimum distance from the center of the design data D2 to the outer circumference of the area with the mask pattern density d2 is Rd3.

In design data D3, the mask pattern density of an area, whose external shape is rectangular, around the mask pattern area A1 arranged at the center of the design data D3 is d1. A minimum distance from the center of the design data D3 to the outer circumference of the design data D3 is Rd3.

The design data D4 is design data in which the area with the mask pattern density d1 and the area with the mask pattern density d2 are replaced with each other in the design data D1. In other words, in the design data D4, the mask pattern density of an area whose external shape shown with diagonal lines around the mask pattern area A1 arranged at the center of the design data D4 is d2. The shape of the area of the design data D4 with the mask pattern density d2 is similar to the shape of the mask pattern area A1. Additionally, a minimum distance from the center of the design data D4 to the outer circumference of the area with the mask pattern density d2 is Rd1. In the design data D4, the mask pattern density of an area, whose external shape is rectangular, around the area with the mask pattern density d2 is d1. A minimum distance from the center of the design data D4 to the outer circumference of the area with the mask pattern density d1 is Rd3.

The design data 5 is design data in which the area with the mask pattern density d1 and the area with the mask pattern density d2 are replaced with each other in the design data D2. In other words, in the design data 5, the mask pattern density of an area, whose external shape shown with diagonal lines is rectangular, around the mask pattern area A1 arranged at the center of the design data D5 is d2. The shape of the area of the design data D5 with the mask pattern density d2 is similar to the shape of the mask pattern area A1. Furthermore, a minimum distance from the center of the design data D5 to the outer circumference of the area with the mask pattern density d2 is Rd2. In the design data D5, the mask pattern density of an area, whose external shape is rectangular, around the area with the mask pattern density d2 is d1. A minimum distance from the center of the design data D5 to the outer circumference of the area with the mask pattern density d1 is Rd3.

In the design data D6, the mask pattern density of an area, whose external shape shown with diagonal lines is rectangular, around the mask pattern area A1 arranged at the center of the design data D6 is d2. A minimum distance from the center of the design data D6 to the outer circumference of the design data D6 is Rd3.

A description will be given of an example of a method for setting the wide reference area 12 with reference to FIG. 9. Hereinafter, a description will be given of the method for setting the wide reference area 12 by forming an investigation pattern on the wafer by use of mask data for investigation that is generated based on the design data D1 to D6 shown in FIGS. 11A to 11F.

Figure 9:
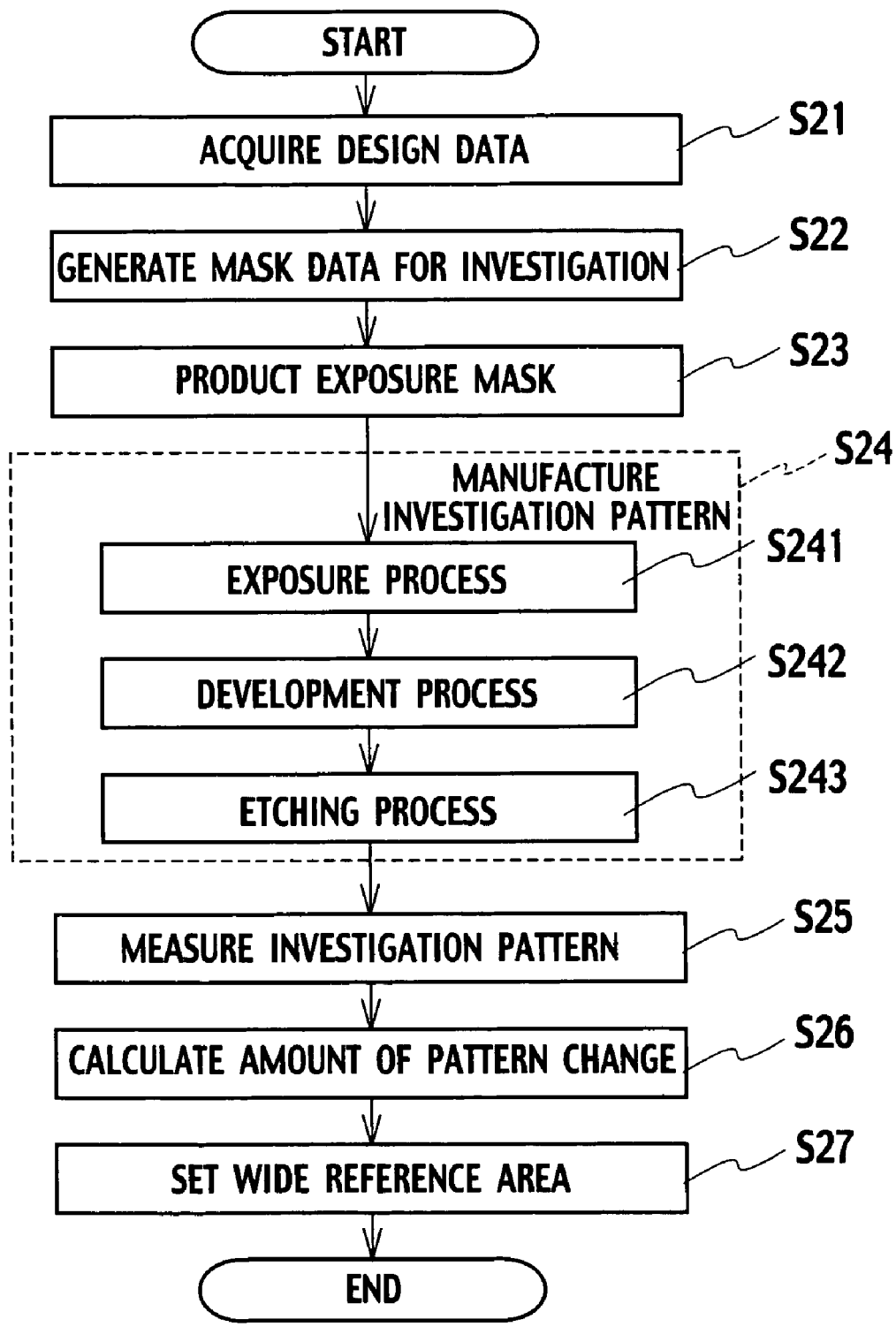
FIG. 9 is a flowchart explaining a method for setting a wide reference area according to the embodiment of the present invention.

In Step S21 of FIG. 9, the information of the design data D1 to D6 shown in FIGS. 11A to 11F and the information of a desired shape pattern of an investigation pattern formed on the wafer based on the design data D1 to D6 are stored in the design data field 201 through the input unit 30 shown in FIG. 1. Moreover, a change amount reference value $CD_{std}$ is stored in the setup condition field 202 through the input unit 30.

In Step S22, the mask data generator 160 reads design data from the design data field 201. The mask data generator 160 generates the mask data for investigation of the design data D1 to D6, based on the design data. The generated mask data for investigation is stored in the mask data field 230.

In Step S23, a mask production unit reads the mask data for investigation stored in the mask data field 230 through the output unit 40. The mask production unit produces an exposure mask 65 for attaching to, for example, the exposure equipment shown in FIG. 3, based on the mask data for investigation.

In Step S24, the mask pattern on the exposure mask 65, which is produced in Step S23, is projected on the wafer 7 by the exposure equipment 6, thus manufacturing a semiconductor device. That is, in Step S241 of FIG. 9, a photoresist film on the wafer 7, is exposed to light by the exposure equipment 6 to which the exposure mask 65 is attached. Next, in Step S242, the photoresist film exposed to light is developed, and a mask for etching is formed. Then, in Step S243, the mask for etching formed in Step S242 is used to perform an etching process, thus manufacturing the investigation pattern designed with the width W1 on the wafer 7.

In Step S25, a pattern measurement unit measures the pattern shape of the investigation pattern designed with the width W1, which is manufactured on the wafer. The measured data is stored in the measurement data field 213 through the input unit 30 of the system 1 for generating mask data shown in FIG. 1.

Figure 12:
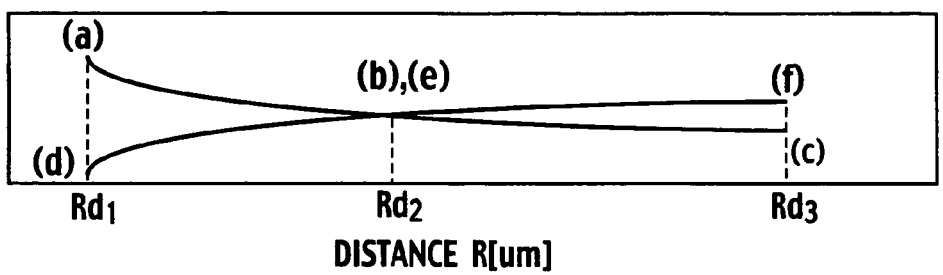
FIG. 12 is a graph showing a relation between a distance from the center of the mask pattern area and the pattern change amount.

In Step S26, the wide area setting module 120 reads the measured data stored in the measurement data field 213 and the information of a desired shape pattern of the investigation pattern stored in the design data field 201. The wide area setting module 120 compares the measured data and the desired shape pattern, thus acquiring the pattern change amount of the investigation pattern. The information of the acquired pattern change amount and a distance R from the center of the mask pattern area A1 is stored in the change amount field 214. FIG. 12 shows an example of a relation between the distance R and the pattern change amount. As shown in (a) to (c) in FIG. 12, the closer the distance R from the center of the mask pattern area A1 to the area where the mask pattern density d1 increases to the mask pattern density d2 is, the larger the pattern change amount is. Additionally, as shown in (d) to (f) in FIG. 12, the closer the distance R from the center of the mask pattern area A1 to the area where the mask pattern density d2 decreases to d1 is, the smaller the pattern change amount is.

In Step S27, the wide area setting module 120 reads the information of the distance R and the pattern change amount, which is stored in the change amount field 214. The wide area setting module 120 sets, as a wide reference distance r2, the distance R from the center of the mask pattern area A1 in which the pattern change amount becomes smaller than the change amount reference value $CD_{std}$ read from the setup condition field 202. As shown in FIG. 2, the wide area setting module 120 determines the wide reference area 12, setting a minimum distance from the center of the wide reference area 12 to the outer circumference as the wide reference distance r2. The information of the wide reference distance r2 and the wide reference area 12 is stored in the wide reference area field 212.

In the foregoing description, the example showed where the wide reference setting module 120 of the system 1 acquires the pattern change amount. However, the pattern change amount may be stored in the change amount field 214 through the input unit 30 of the system 1, after acquiring the pattern change amount by use of other equipment.

The foregoing description gives the case of one wide reference area 12 to make the description easier to understand. However, a plurality of wide reference areas 12 having spaces different from each other may be set if necessary. Further, an appropriate wide reference area is selected from among the plurality of wide reference areas in accordance with the shape of the wide correction area and the like, thus correcting the process proximity effects with reference to the selected wide reference area.

Figure 10A:
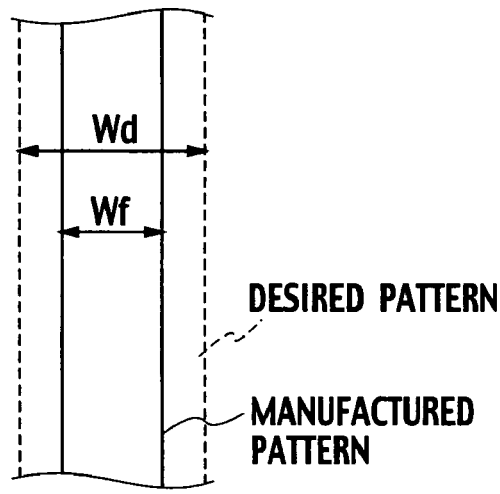
FIGS. 10A through 10B show patterns to explain the correction data of the mask pattern.
Figure 10B:
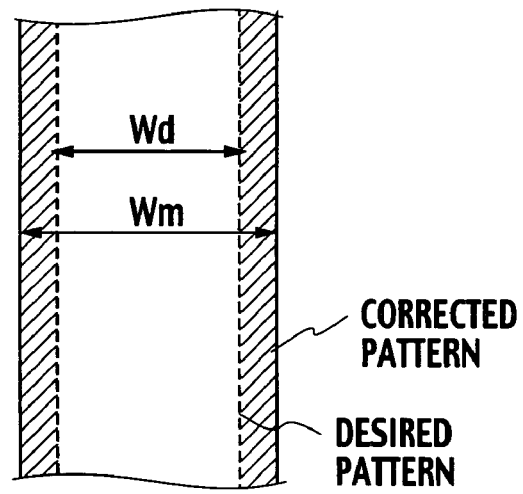
Figure 11A:
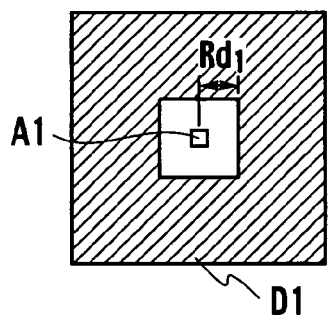
FIGS. 11A through 11F show exemplary design data to explain a method for setting the wide reference area.
Figure 11B:
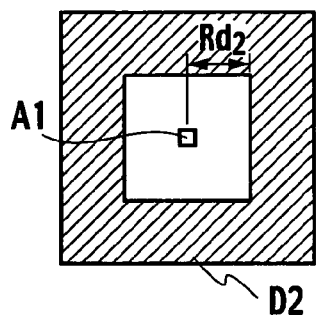
Figure 11C:
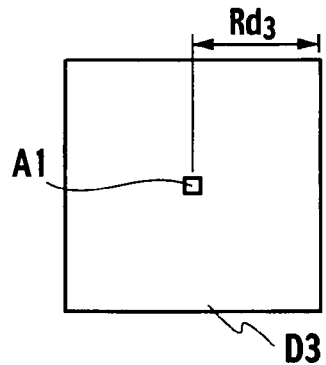
Figure 11D:
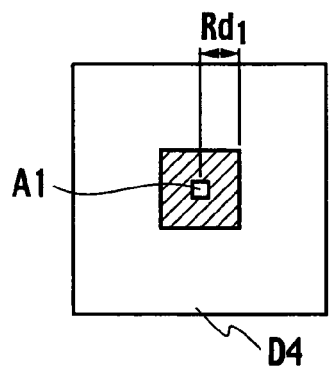
Figure 11E:
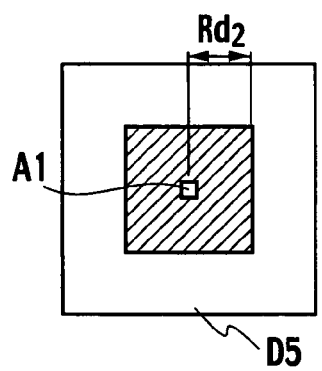
Figure 11F:
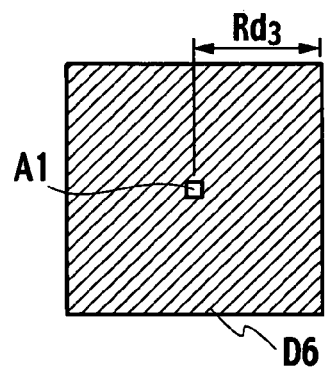

The process proximity correction is made with reference to the basic mask pattern correction data calculated in consideration of the process proximity effects in the basic reference area 11, and to a wide mask pattern correction data calculated in consideration of the process proximity effects in the wide reference area 12. The surrounding patterns which exercise an influence of the process proximity effects on a pattern targeted for the process proximity correction are different in the basic reference area 11 and the wide reference area 12. Hence, the basic and wide mask pattern correction data are generally different. However, it is possible to acquire the basic and wide mask pattern correction data in the same method. For example, a semiconductor device is manufactured by methods such as described in FIG. 9, and then calculating the basic and wide mask pattern correction data. Specifically, an exposure mask is firstly produced by using a mask pattern for making the process proximity correction. A semiconductor device is then manufactured by performing lithography and etching processes and the like by use of the produced exposure mask. The shape data is acquired by measuring the pattern of the manufactured semiconductor device. Next, each of the basic and wide mask pattern correction data necessary to acquire a desired shape pattern is calculated from a difference in shape between the measured shape data and the desired shape pattern. For example, consideration is given to a case where a pattern with a desired width Wd, shown with broken lines in FIG. 10A, is manufactured by use of a mask pattern with the width Wd. As shown with solid lines in FIG. 10A, a pattern manufactured on the wafer is assumed to be formed with a width Wf narrower than the width Wd. In that case, a width ΔW which is the difference in shape between the widths Wd and Wf is set to be the correction data of the mask pattern. Then, mask data is generated as the process proximity correction with a width Wm shown with solid lines, which is wider by the width ΔW than the width Wd of the desired pattern shown with broken lines in FIG. 10B. A part shown with diagonal lines in FIG. 10B is correction data. It is possible to form the desired pattern with the width Wd on the wafer by using the mask data with the width Wm.

As another method for calculating correction data, it is also possible to use correction data which is compiled into a database upon generating similar mask data, after the basic and wide mask pattern correction data are compiled into the database. Additionally, the influence of the proximity effects may be predicted by use of a process simulator, thus calculating the basic and wide mask pattern correction data.

(Wide Correction Area Extraction Method)

Next, a description will be given of an example of a method for extracting, from design data, a wide correction area necessary to make the process proximity correction in consideration of the wide-range process proximity effects with the system 1, shown in FIG. 1, by use of a flowchart of FIG. 13 and FIGS. 14 and 15.

In Step S31, design data is stored in the design data field 201 through the input unit 30 shown in FIG. 1. An extraction condition on the extraction of a wide correction area is stored in the extraction condition field 203 through the input unit 30. The extraction condition may be previously stored in the extraction condition field 203.

Figure 14:
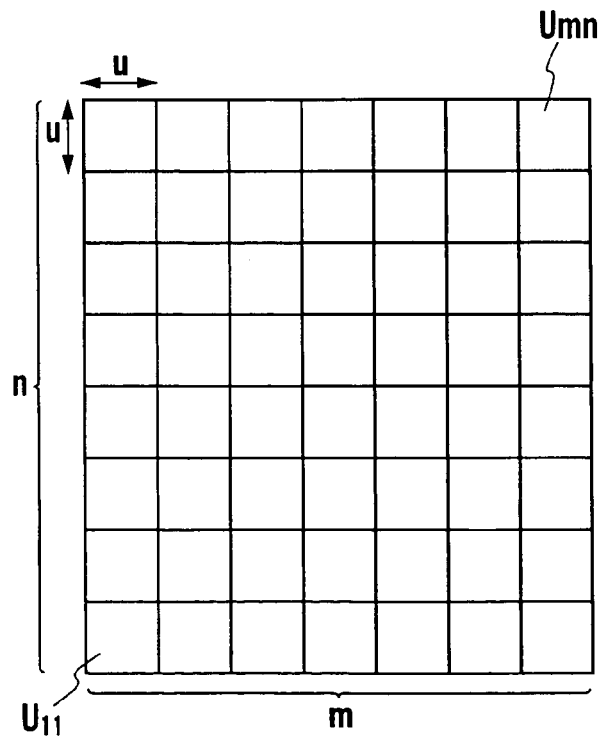
FIG. 14 shows an example of dividing the design data into the blocks according to the embodiment of the present invention.

In Step S32, the block setting module 131 divides the design data into a plurality of virtual blocks $U_{11}$ to $U_{mn}$ on the chip area, for example, as shown in FIG. 14. FIG. 14 shows an example of dividing the design data into the blocks $U_{11}$ to $U_{mn}$ of m×n, each of the blocks being a square with a length of one side being u (m and n are integers equal to or greater than 2). Therefore, each space Su of the blocks $U_{11}$ to $U_{mn}$ is u×u. However, the design data is divided so that the sizes of the blocks $U_{11}$ to $U_{mn}$ are larger than the size of the basic reference area 11, and is smaller than the size of the wide reference area 12. The basic reference area 11 is set by a method described in FIG. 4, for example. The wide reference area 12 is set by a method described in FIG. 9, for example. The information of the locations of the blocks $U_{11}$ to $U_{mn}$, the design data and the like is stored in the block data field 215.

In Step S33, the parameter processor 132 reads the information of the blocks $U_{11}$ to $U_{mn}$ from the block data field 215. The parameter processor 132 calculates the value of each parameter of the blocks $U_{11}$ to $U_{mn}$. The parameters to be calculated are wafer pattern density $\alpha_{11}$ to $\alpha_{mn}$, mask pattern density $\beta_{11}$ to $\beta_{mn}$, optical density $\epsilon_{11}$ to $\epsilon_{mn}$, mask pattern circumference lengths $\delta_{11}$ to $\delta_{mn}$, and the like. The wafer pattern density $\alpha_{11}$ to $\alpha_{mn}$ are values found by dividing the total space of the pattern formed respectively on the wafer of the blocks $U_{11}$ to $U_{mn}$ by the space Su of the blocks $U_{11}$ to $U_{mn}$. The mask pattern density $\beta_{11}$ to $\beta_{mn}$ are values found by dividing the total space of each mask pattern of the blocks $U_{11}$ to $U_{mn}$ by the space Su. The optical density $\epsilon_{11}$ to $\epsilon_{mn}$ are defined by average image intensity in the blocks $U_{11}$ to $U_{mn}$. The mask pattern circumference lengths $\delta_{11}$ to $\delta_{mn}$ are the lengths of each mask pattern circumference of the blocks $U_{11}$ to $U_{mn}$. The calculated parameter values are stored in the block data field 215 in a format of a table shown in FIG. 15, for example.

In Step S34, the parameter processor 132 reads the parameter values of the blocks $U_{11}$ to $U_{mn}$ stored in the block data field 215. The parameter processor 132 calculates the average value $\alpha_{avr}$ of the wafer pattern density $\alpha_{11}$ to $\alpha_{mn}$, the average value $\beta_{avr}$ of the mask pattern density $\beta_{11}$ to $\beta_{mn}$, the average value $\epsilon_{avr}$ of the optical density $\epsilon_{11}$ to $\epsilon_{mn}$, the average value $\delta_{avr}$ of the mask pattern circumference lengths $\delta_{11}$ to $\delta_{mn}$, and the like. The calculated average values $\alpha_{avr}$, $\beta_{avr}$, $\epsilon_{avr}$, $\delta_{avr}$ and the like of the respective parameters are stored in the parameter field 216.

In Step S35, the block selecting module 133 reads the parameter values of the blocks $U_{11}$ to $U_{mn}$ from the block data field 215, and the average values $\alpha_{avr}$, $\beta_{avr}$, $\epsilon_{avr}$, $\delta_{avr}$ and the like of each parameter from the parameter field 216, respectively. The block selecting module 133 extracts a wide correction area with reference to the extraction condition from the extraction condition field 203. In other words, the block selecting module 133 extracts, as a wide correction area, a block in which a difference between the parameter values of the blocks $U_{11}$ to $U_{mn}$ and the average values $\alpha_{avr}$, $\beta_{avr}$, $\epsilon_{avr}$, $\delta_{avr}$ of each parameter is larger than the extraction condition. Note that the parameter to be used for the extraction may be any one of the wafer pattern density $\alpha_{11}$ to $\alpha_{mn}$, the mask pattern density $\beta_{11}$ to $\beta_{mn}$, the optical density $\epsilon_{11}$ to $\epsilon_{mn}$, the mask pattern circumference lengths $\delta_{11}$ to $\delta_{mn}$, and the like. Additionally, a plurality of parameters may be used for the extraction. The information of the extracted wide correction area is stored in the extracted area field 217.

The wide correction area is extracted from the design data with reference to the parameters of the virtual blocks $U_{11}$ to $U_{mn}$ on the chip area. The foregoing description was given of the example of extracting the wide correction area based on the difference between the calculated parameter values in the blocks $U_{11}$ to $U_{mn}$ and the average values $\alpha_{mn}$, $\beta_{avr}$, $\epsilon_{avr}$, $\delta_{avr}$ and the like of each parameter. As another method for extracting the wide correction area, the change rate of the parameter may be set as a reference.

Figure 17B:
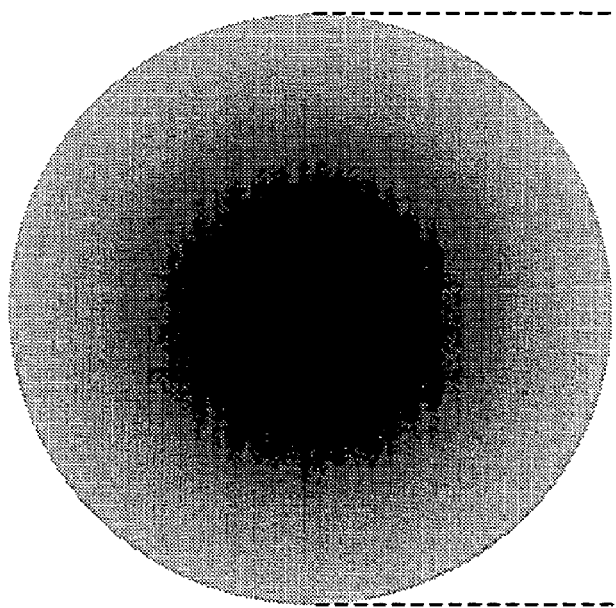
FIGS. 17A through 17B show exemplary Gaussian distribution function to explain a method for setting the wide reference area.
Figure 17A:
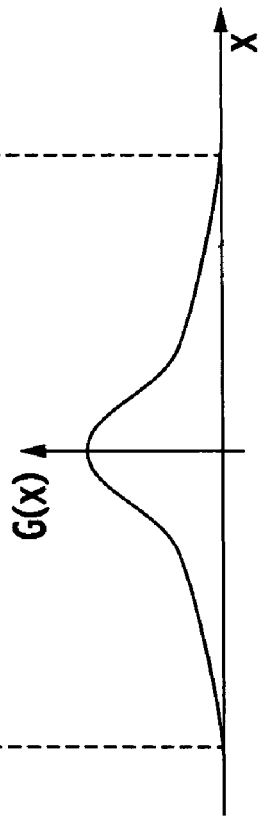

Alternatively, the wide correction area may be extracted by assigning weights to the parameter values of the blocks $U_{11}$ to $U_{mn}$ for the simulation of a pattern shape, after the manufacture, in consideration of the influence of the pattern density of the surrounding block. FIG. 16 shows an example of dividing the design data into blocks $U_{11}$ to $U_{55}$ and calculating mask pattern density $\beta_{11}$ to $\beta_{55}$ of the blocks $U_{11}$ to $U_{55}$. The mask pattern density $\beta_{33}$ of the block $U_{33}$ in the center, shown in FIG. 16, is 0.4. Concerning the influence of the process proximity effects exercised on the block $U_{33}$ by the mask pattern density of the surrounding block, the closer the block is to the block $U_{33}$, the larger the influence, while the farther the block is from the block $U_{33}$, the smaller the influence. Hence, the weighted mask pattern density $\beta C_{33}$ of the block $U_{33}$ in consideration of the influence of the mask pattern density of the surrounding block can be found by performing a convolution of the Gaussian distribution function shown in FIGS. 17A to 18 on the mask pattern density of the blocks $U_{11}$ to $U_{55}$. FIG. 17A is a Gaussian distribution function which shows an influence of the process proximity effects exercised on the block $U_{33}$ by the mask pattern density of the chip area, and shows that the influence is larger in the center of the chip area and that the influence is smaller in the periphery portion. FIG. 17B shows values set as Gaussian distribution function values in the respective areas of the chip area corresponding to the blocks $U_{11}$ to $U_{55}$ shown in FIG. 16, based on the Gaussian distribution function shown in FIG. 17A. For example, when calculating the weighted mask pattern density $\beta C_{33}$ of the block $U_{33}$ by performing the convolution with the mask pattern density $\beta_{11}$ to $\beta_{55}$ of the blocks $U_{11}$ to $U_{55}$ shown in FIG. 16 and the Gaussian distribution function values shown in FIG. 17B, the weighted mask pattern density $\beta C_{33}$ is 0.497.

The weighted mask pattern density $\beta C_{11}$ to $\beta C_{mn}$ of the blocks $U_{11}$ to $U_{mn}$ is calculated by the parameter processor 132 shown in FIG. 1, thus being stored in the block data field 215. Then, the block selecting module 133 compares the extraction condition with the weighted mask pattern density $\beta C_{11}$ to $\beta C_{mn}$ of the blocks $U_{11}$ to $U_{mn}$. The block selecting module 133 extracts the wide correction area.

Moreover, weights are assigned to the change rates of the parameter values of the blocks $U_{11}$ to $U_{mn}$ by the Gaussian function, thus extracting the wide correction area.

Figure 18:
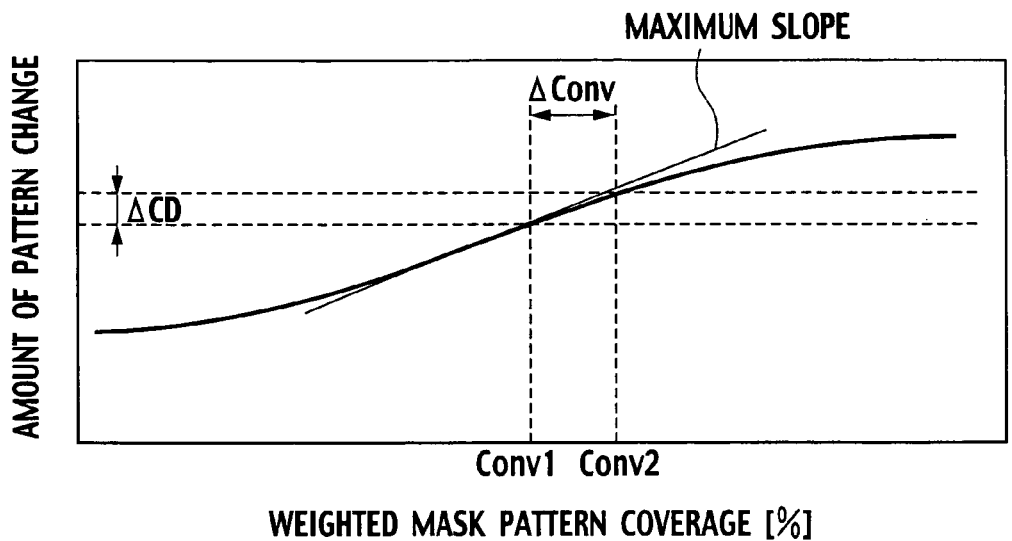
FIG. 18 is a graph showing a relation between weighted mask pattern density and the pattern change amount.

Here, a description will be given of an example of a method for setting a length u of one side of the blocks $U_{11}$ to $U_{mn}$ by use of FIG. 18. The lateral axis of FIG. 18 indicates a weighted mask pattern density at any point where the convolution of the Gaussian distribution function is performed on the design data. The longitudinal axis of FIG. 18 indicates the amount of a pattern change. A weighted mask pattern density $C_{onv1}$ shown in FIG. 18 is a weighted mask pattern density found analytically. On the other hand, a weighted mask pattern density $C_{onv2}$ when the convolution is performed with the Gaussian distribution function values corresponding to the blocks $U_{11}$ to $U_{mn}$ which are divided by the length u of one side.

As shown in FIG. 18, a difference between the weighted mask pattern density $C_{onv1}$ and the weighted mask pattern density $C_{onv2}$ is $\Delta C_{onv}$. Furthermore, a value found by multiplying the difference of the weighted mask pattern density $\Delta C_{onv}$ by a maximum value of a slope of the pattern change amount relative to the weighted mask pattern density is an error $\Delta CD$ of the pattern change amount because of the division of the design data by the blocks $U_{11}$ to $U_{mn}$ with the length u of one side.

Accordingly, a permissible value of the error $\Delta CD$ should be previously set, thus setting the length u of one side of the blocks $U_{11}$ to $U_{mn}$ to satisfy the permissible value. Note that if the length u is made shorter, the difference of the weighted mask pattern density $\Delta C_{onv}$ becomes smaller. However, if the length u is made smaller, the number of the blocks $U_{11}$ to $U_{mn}$ increases. Therefore, it is desired that the length u is long, based on the effects of shortening the extraction time of the wide reference area 12.

(Mask Data Generating Method)

Next, a description will be given of an example of a method for generating mask data with the system 1 for generating mask data shown in FIG. 1, with reference to the flowchart of FIG. 19.

In Step S41, design data is stored in the design data field 201 through the input unit 30 shown in FIG. 1. An extraction condition is stored in the extraction condition field 203, and a change amount reference value for setting the wide reference distance r2 is stored in the setup condition field 202.

Figure 4:
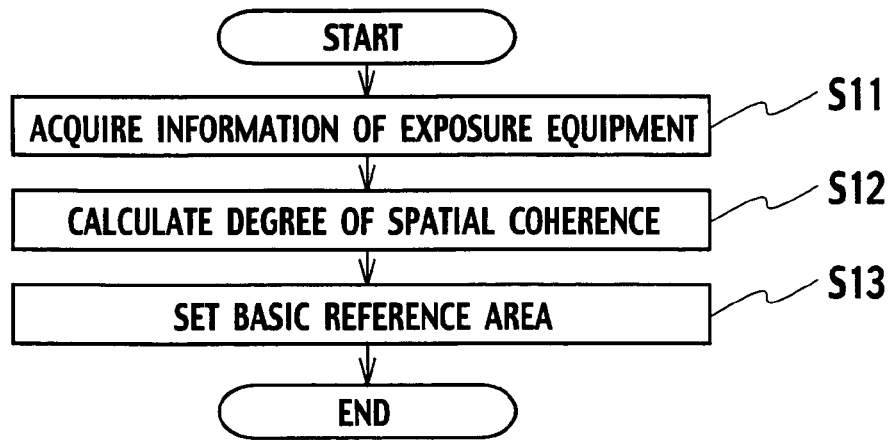
FIG. 4 is a flowchart explaining a method for setting a basic reference area according to the embodiment of the present invention.

In Step S42, the basic area setting module 110 sets the basic reference area 11 by using methods such as the method described in FIG. 4. Basic mask pattern correction data is calculated by the above-mentioned method and the like, in consideration of process proximity effects in the basic reference area 11. Information of the set basic reference area 11 and the calculated basic mask pattern correction data is stored in the basic reference area field 211.

In Step S43, the wide area setting module 120 sets the size of the wide reference area 12 by use of methods such as the method described in FIG. 9. Wide mask pattern correction data is calculated by the above-mentioned method and the like, in consideration of the process proximity effects in the wide reference area 12. In other words, as described in Step S24 of FIG. 9, an investigation pattern is formed on a wafer in the processing steps of exposure, etching and the like, based on the design data. Then, the wide reference area 12 is set based on the measured value of the investigation pattern and a desired shape pattern, and the wide mask pattern correction data is calculated. Information of the set wide reference area 12 and the calculated wide mask pattern correction data is stored in the wide reference area field 212.

Figure 13:
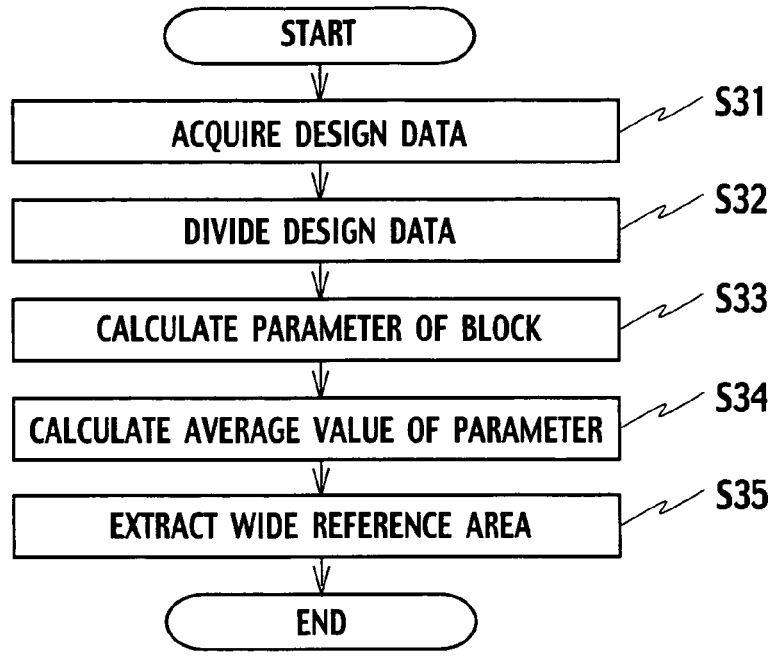
FIG. 13 is a flowchart explaining a method for extracting a wide reference area according to the embodiment of the present invention.

In Step S44, as described, for example, in FIG. 13, the extracting module 130 divides the design data into a plurality of virtual blocks $U_{11}$ to $U_{mn}$ on the chip area. The extracting module 130 extracts a wide correction area based on the parameters of the blocks $U_{11}$ to $U_{mn}$. The information of the extracted area is stored in the extracted area field 217.

In Step S45, the basic correction data generator 140 reads the design data from the design data field 201, and the basic mask pattern correction data from the basic reference area field 211, respectively. The basic correction data generator 140 corrects the process proximity effects of the entire design data with reference to the basic mask pattern correction data. The basic correction data generator 140 generates basic correction data applied to the design data. The generated basic correction data is stored in the basic correction data field 221.

In Step S46, the wide correction data generator 150 reads the wide correction area from the extracted area field 217, and the wide mask pattern correction data from the wide reference area field 212. The wide correction data generator 150 corrects the process proximity effects of the design data of the wide correction area with reference to the wide mask pattern correction data. The wide correction data generator 150 generates wide correction data applied to the design data of the wide correction area. At this point, when the entire data of a layered structure is included in a single wide correction area, the flattening of the design data is performed. Then, a process proximity correction is made on the design data of the relevant wide correction area. When the entire data of a layered structure is not included in a single wide correction area, a process proximity correction is made without performing the flattening of the design data. The generated wide correction data is stored in the wide correction data field 222.

In Step S47, a mask data generator 160 generates mask data by applying the basic correction data read from the basic correction data field 221 and the wide correction data read from the wide correction data field 222 to the design data read from the design data field 201. Methods for generating the mask data, for example, may include a method for generating the mask data by applying, to the design data, basic correction data of an area that overlaps the wide correction area in which the wide correction data is generated while replacing the basic correction data with the wide correction data. The generated mask data is stored in a mask data field 230. The mask data can be provided from the output unit 40 in formats such as an electronic file, and is used for producing the exposure mask for the exposure equipment, and the like.

In the foregoing description, examples were shown where the process proximity effects are corrected for the entire design data in Step S45, and where the process proximity effects are corrected for the design data of the wide correction area in Step S46. However, the order of Steps S45 and S46 may be reversed.

In addition, in Step S47, synthetic correction data is generated, in which the basic correction data of the area that overlaps the wide correction area where the wide correction data is generated are all replaced with the wide correction data. Thereafter, the mask data may be generated by applying the synthetic correction data.

With the method for generating mask data according to the embodiment of the present invention, when extracting a wide correction area from design data and including the design data of a layered structure in the wide correction area, the flattening of the design data is performed only on the wide correction area. Thus, the process proximity correction is made. Therefore, compared with a case where the process proximity correction is made for the entire design data with reference to the wide mask pattern correction data, it is possible to suppress an increase in processing time of the process proximity correction and an increase in the process proximity correction data, which are caused by the flattening of the design data.

Moreover, unlike a method for making the process proximity correction together with an electron beam irradiation amount correction, it is possible to check correction data after the process proximity correction. The correction data check may be to check the basic and wide correction data, respectively, or may be to check after replacing all the basic correction data of the area that overlaps the area where the wide correction data is generated with the wide correction data.

Figure 19:
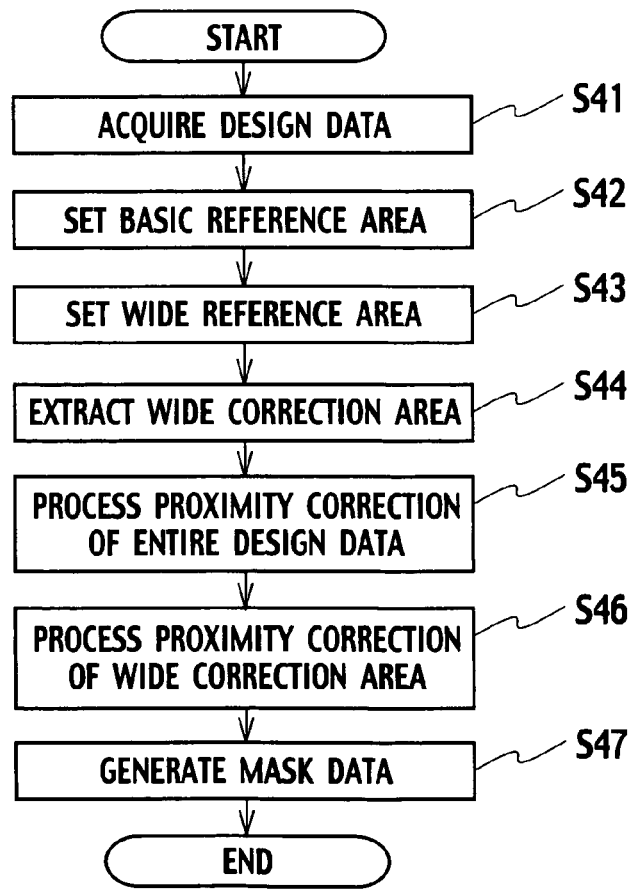
FIG. 19 is a flowchart explaining a method for generating mask data according to the embodiment of the present invention.

A series of recipe making operations shown in FIG. 19 may be carried out by controlling the system for generating mask data, shown in FIG. 1, by use of a program algorithm equivalent to that shown in FIG. 19. The program should be stored in the memory 20 of the automatic recipe making system 1a shown in FIG. 1. In addition, a series of operations for making mask data of the present invention may be carried out by storing such a program in a computer-readable recording medium and instructing the memory 20, shown in FIG. 1, to read the recording medium.

Figure 20:
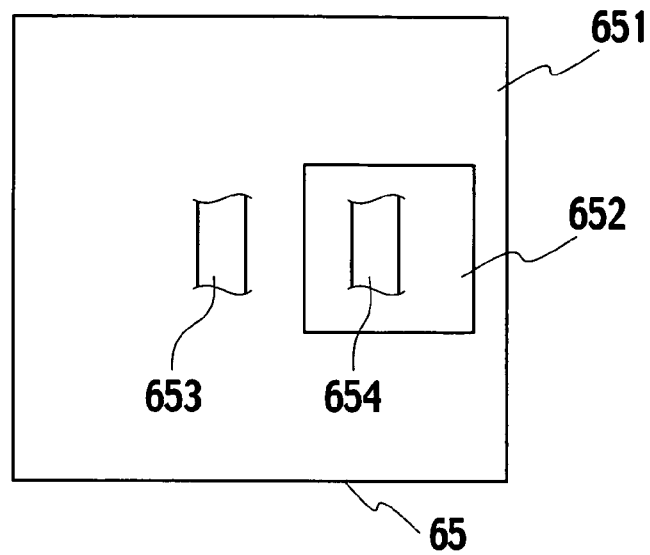
FIG. 20 shows a schematic structure of an exposure mask according to an embodiment of the present invention.

For example, as shown in FIG. 20, the exposure mask 65, which is produced based on the mask data generated by the system 1 shown in FIG. 1, has a first mask area 651 and a second mask area 652. A mask pattern 653, in which basic correction data generated by making the process proximity correction with reference to the basic mask pattern correction data, is arranged in the first mask area 651. A mask pattern 654, in which wide correction data generated by making the process proximity correction with reference to the wide mask pattern correction data, is arranged in the second mask area 652. As already described, the process proximity correction with reference to the wide mask pattern correction data is made for a wide correction area extracted from the design data based on the mask pattern density and the like in consideration of the influence of the wide-range process proximity effects. Therefore, there is a possibility that mask patterns, in which different process proximity correction data are applied, are arranged in the first mask area 651 and the second mask area 652, respectively, in the exposure mask 65 shown in FIG. 20.

Figure 21:
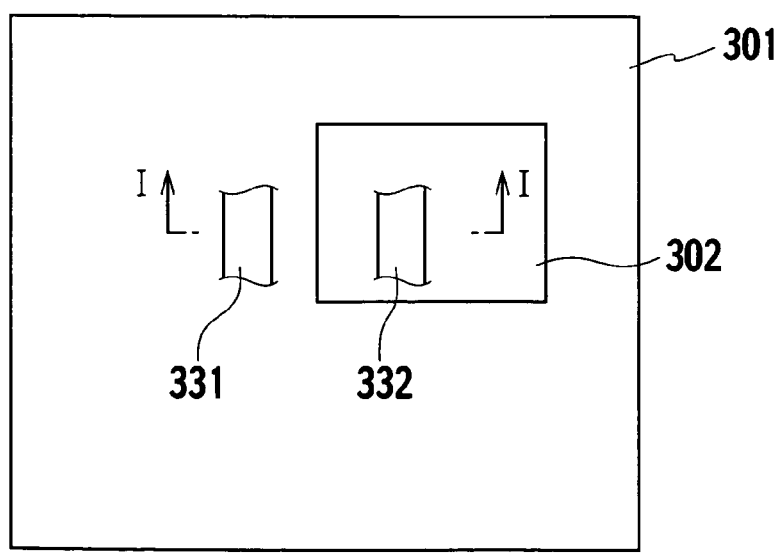
FIG. 21 shows a top view of a semiconductor device manufactured using a method for manufacturing a semiconductor device according to the embodiment of the present invention.

By using the mask data generated by the system 1 shown in FIG. 1, it is possible to manufacture a semiconductor device for which the above-mentioned process proximity correction is made, as shown in FIG. 21. In other words, a semiconductor device is manufactured by: producing an exposure mask by use of generated mask data; and processing the surface of a semiconductor substrate in a photolithography process by use of the exposure mask.

Figure 22:
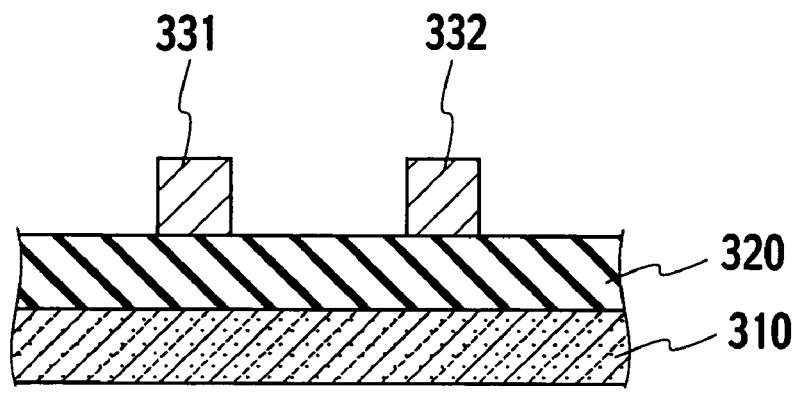
FIG. 22 shows a sectional view of a semiconductor device manufactured using a method for manufacturing a semiconductor device according to the embodiment of the present invention.

A semiconductor device shown in FIG. 21 includes a first area 301 on which the mask pattern of the first mask area 651, where the process proximity correction is made with reference to the basic mask pattern correction data, is transferred; and a second area 302 on which the mask pattern of the second mask area 652, where the process proximity correction is made with reference to the wide mask pattern correction data, is transferred. In other words, a first wiring 331, which is formed by transferring the mask pattern 653 where the basic correction data is applied to the design data, is arranged in the first area 301. A second wiring 332, which is formed by transferring the mask pattern 654 where the wide correction data is applied to the design data, is arranged in the second area 302. FIG. 22 is a sectional view taken along the I-I direction in FIG. 21. As shown in FIG. 22, the semiconductor device includes a substrate 310, an insulating film 320 disposed on the substrate 310, and the first wiring 331 and the second wiring 332, the wirings being disposed on the insulating film 320. The first wiring 331 and the second wiring 332 are formed by patterning a conduction film 330.

A description will be given of a method for manufacturing a semiconductor device by use of FIGS. 23 to 26. Note that the method for manufacturing a semiconductor device described below is an example, and it is natural that a semiconductor device can be realized by various manufacturing methods other than this example, including this modification example.

Figure 23:
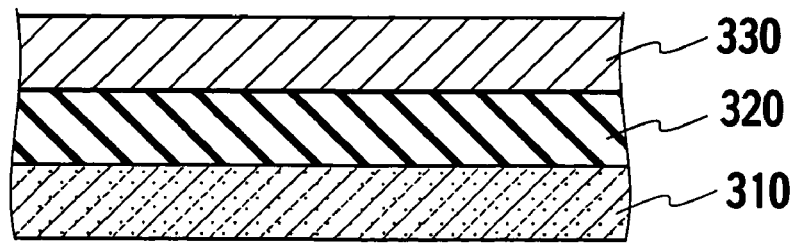
FIGS. 23 through 26 show structural sectional views of the semiconductor device to explain the method for manufacturing a semiconductor device according to the embodiment of the present invention.
Figure 24:
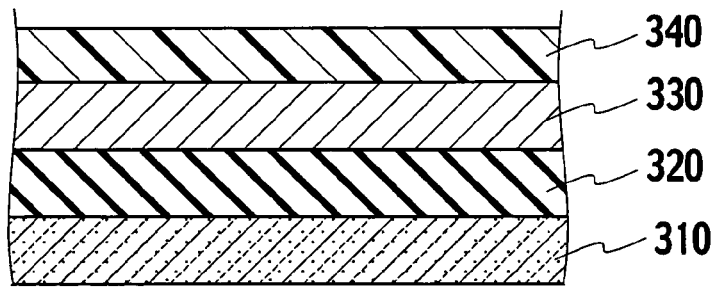
Figure 25:
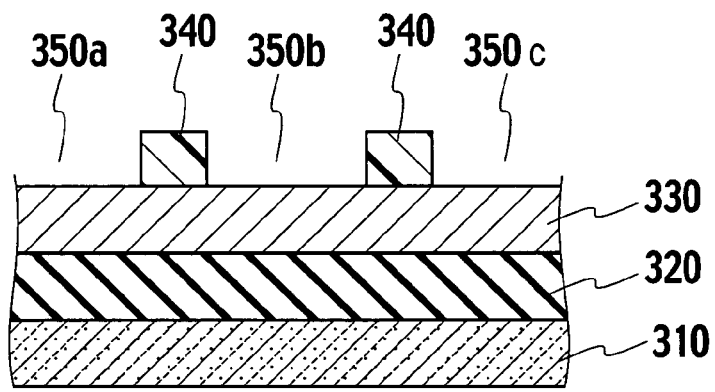
Figure 26:
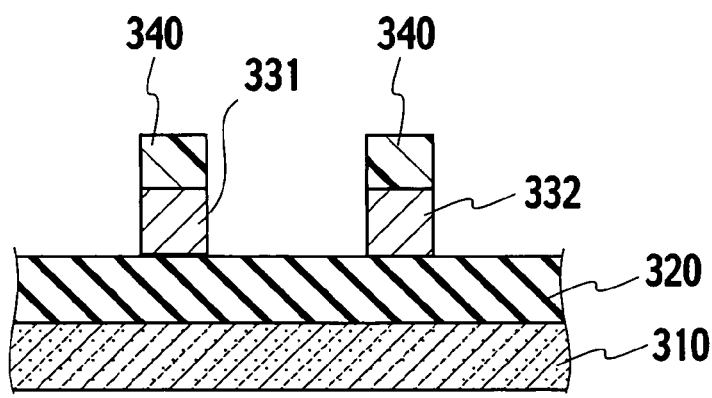

The design data of the conduction film 330 is divided into a plurality of blocks on the chip area by methods such as described in FIG. 13, thus extracting a wide correction area in which it is necessary to consider the influence of the process proximity effects on the basis of the parameters of its block. When the data of a layered structure of the conduction film 330 is included in the wide correction area, wide correction data is generated by methods such as described in FIG. 19, by making the process proximity correction of the design data of the wide correction area after only the data of the layered structure is developed. The mask data of the conduction film 330 is generated by applying the generated wide correction data to the wide correction area. The exposure mask of the conduction film 330 is produced based on the mask data of the generated conduction film 330. An element separation area is formed inside the substrate 310, and a diffusion area and the like are formed inside an active area surrounded by the element separation area. Thus, active elements including a transistor are integrated. The insulating film 320 is formed over all the substrate 310 where the active elements are disposed, by use of a technique such as chemical vapor deposition (CVD), and is flattened by chemical mechanical polishing (CMP) and the like. Subsequently, although it is not shown, a contact hole is opened on a predetermined electrode of the active element by photolithography and etching techniques. A metal film such as copper is thereafter deposited over all the insulating film 320 by plating vapor deposition and the like. Then, the surface is flattened by CMP and the like to form the conduction film 330 so as to bury the contact hole on each electrode. Thus, a sectional structure is obtained as shown in FIG. 23. As shown in FIG. 24, a photoresist film 340 is applied over all the conduction film 330. Next, patterning is performed on the conduction film 330 by methods such as described in Step S24 of FIG. 9. In other words, the exposure mask of the conduction film 330 is attached to the exposure equipment 6 shown, for example, in FIG. 3, exposing the photoresist film 340 to the beam passing through the pattern on the exposure mask of the conduction film 330. Openings 350a to 350c are formed by developing the photoresist film 340 that is exposed to light, thus exposing a part of the surface of the conduction film 330 as shown in FIG. 25. The conduction film 330 is removed by selective etching by use of methods such as reactive ion etching (RIE) while using the photoresist film 340 as a mask. Then, the conduction film 330 is patterned, thus forming the first wiring 331 and the second wiring 332, which are shown in FIG. 26. The semiconductor device shown in FIG. 22 is completed by removing the photoresist film 340.

In the foregoing description, an example was shown of using an exposure mask produced based on the mask data which is generated by the system 1 in the process of patterning the conduction film 330. However, it is natural that an exposure mask for which the process proximity correction is made can be used in other processes using the photolithography technique.

According to the method for manufacturing a semiconductor device described above, it is possible to provide a semiconductor device having a pattern with a desired shape, without triggering an increase in processing time of the process proximity correction and an increase in the process proximity correction data, the increases being caused by the flattening of the design data.

(Modification)

Figure 27:
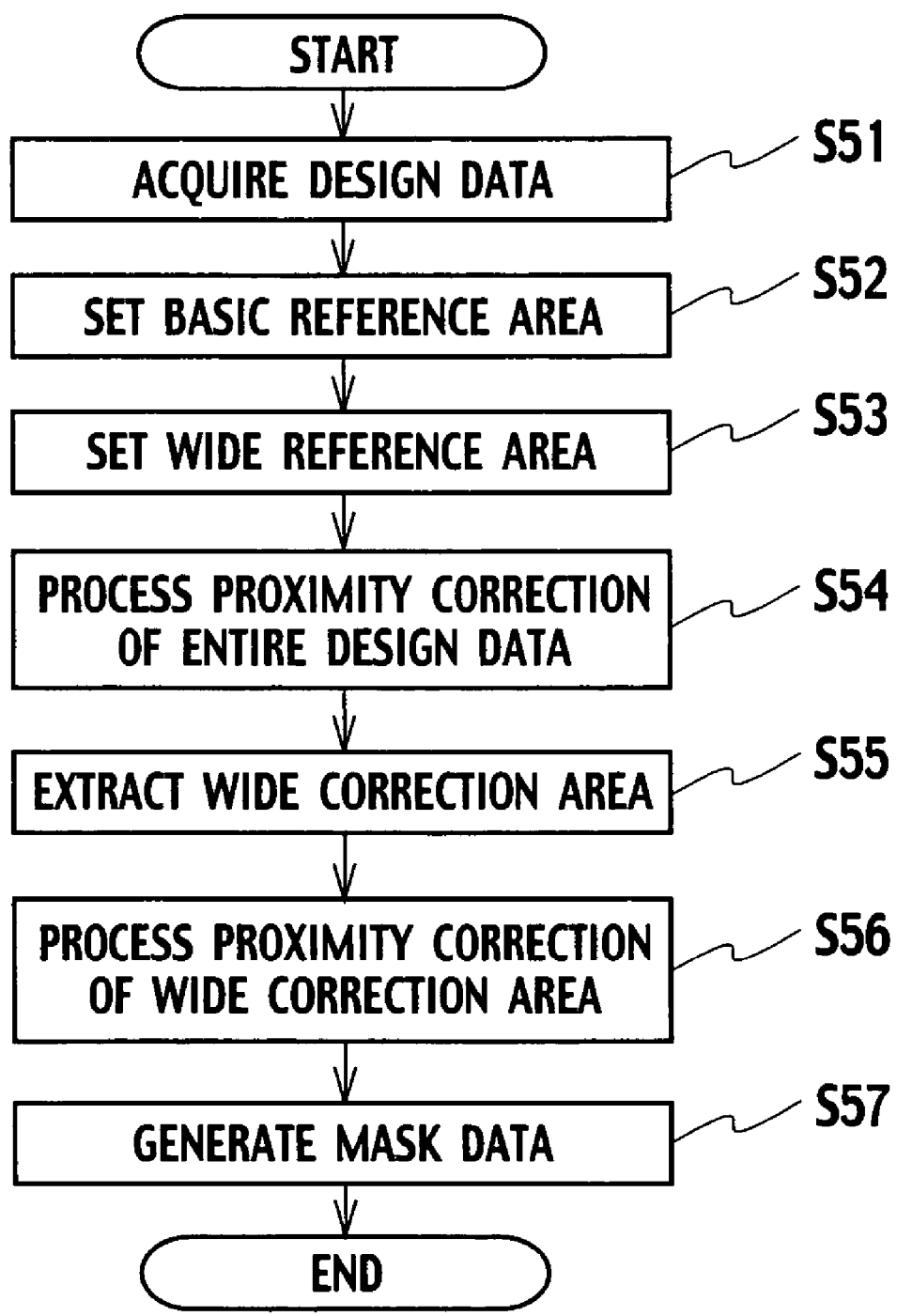
FIG. 27 is a flowchart explaining a method for generating mask data according to a modification of the embodiment of the present invention.

FIG. 27 shows a modification of the method for generating mask data with the system 1 according to the embodiment of the present invention. In the method for generating mask data shown in FIG. 27, the process proximity correction is firstly made for the entire design data with reference to the basic mask pattern correction data. A wide correction area is then extracted by use of data after making the process proximity correction for the entire design data. This point is different from the method for generating mask data shown in FIG. 19.

In Step S54 shown in FIG. 27, the process proximity correction is made for design data read by the basic correction data generator 140 from the design data field 201 with reference to the basic mask pattern correction data. The basic correction data generated by carrying out the process proximity correction is stored in the basic correction data field 221.

In Step S55, for example as shown in FIG. 14, the block setting module 131 divides the design data in which the process proximity effects are corrected by applying the basic correction data, into the blocks $U_{11}$ to $U_{mn}$. Then, the parameter processor 132 calculates the value of each parameter for the blocks $U_{11}$ to $U_{mn}$. The parameter to be calculated is, for example, an average light intensity after the process proximity correction, and the like. Subsequently, the extracting module 130 extracts a wide correction area based on the calculated values of the parameters of the blocks $U_{11}$ to $U_{mn}$ and an extraction condition read from the extraction condition field 203. The extracted area is stored in the extracted area field 217. The other steps are the same as those of the method for generating mask data shown in FIG. 19.

Other Embodiments

Figure 28:
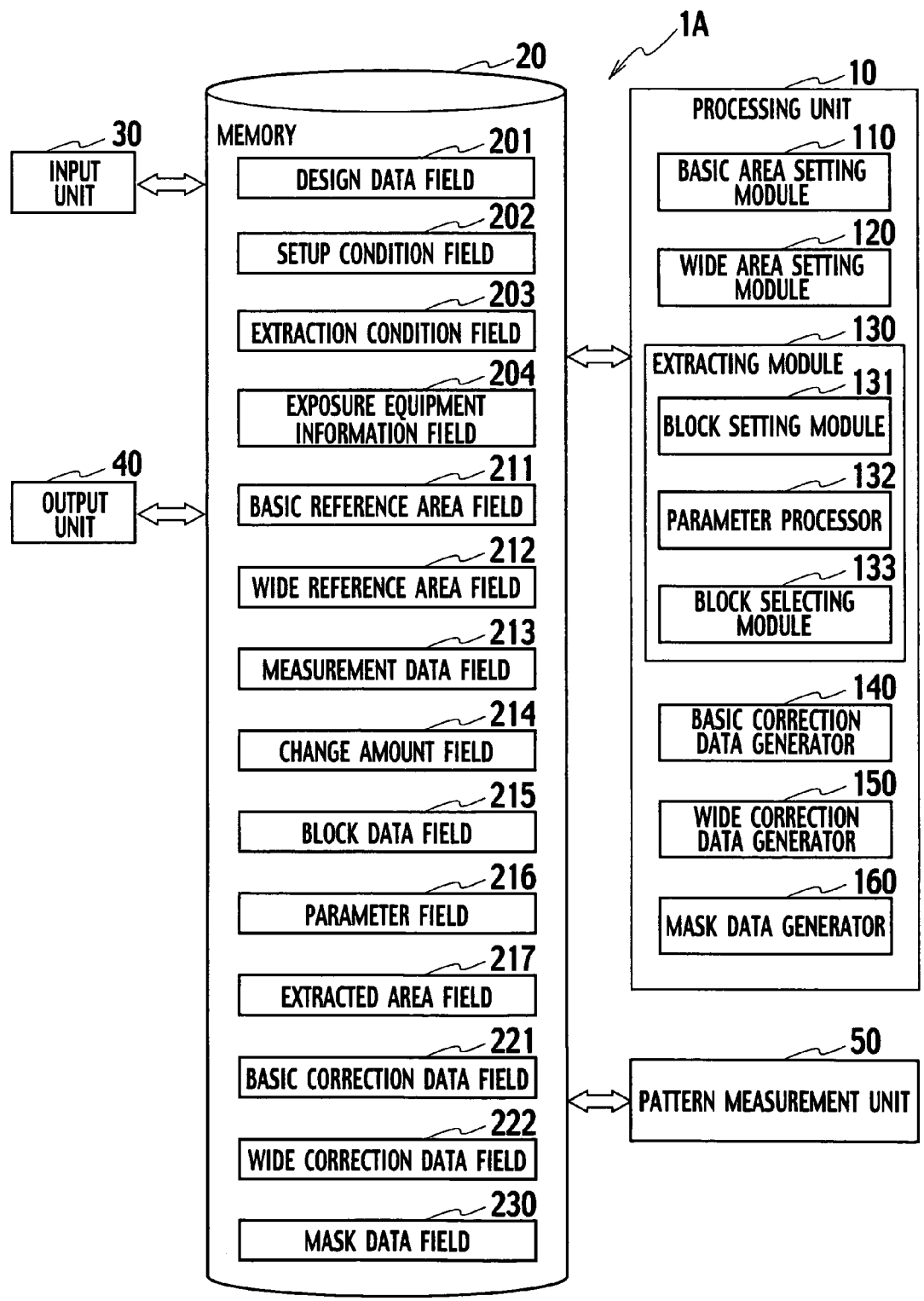
FIG. 28 shows a schematic structure of a system for generating mask data according to other embodiments of the present invention.

In the foregoing description of the embodiment, the description was given of the example of measuring the shape of the pattern formed on the wafer based on the pattern designed with the width W1 by the external unit in Step S25 in the method for setting the wide reference distance r2 described in FIG. 9. However, the shape of a pattern formed on a wafer may be measured by a system 1A for generating mask data further including a pattern measurement unit shown in FIG. 28, for example.

Various modifications will become possible for those skilled in the art after receiving the teachings of the present disclosure without departing from the scope thereof.

What is claimed is:

1. A system for generating mask data, comprising:
   an extracting module configured to extract a block necessary to apply a correction for wide-range process proximity effects as a wide correction area from a plurality of blocks by comparing at least one parameter selected from the group consisting of a wafer pattern density, a mask pattern density, an optical density and mask pattern circumference lengths, which influences the wide-range process proximity effects, of each mask pattern in the blocks with an extraction condition, to design data being divided into the blocks on a chip area;
   a wide-correction data generator configured to generate wide correction data to make the correction applied to the wide correction area;
   a basic area setting module configured to set a basic reference area to include a plurality of patterns which optically influence each other, the sizes of the blocks being larger than the size of the basic reference area and the size of the basic reference area being narrower than an influence range of the wide-range process proximity effects;
   a basic correction data generator configured to generate basic correction data by making the correction with reference to basic mask pattern correction data calculated in consideration of process proximity effects in the basic reference area;
   a wide area setting module configured to set a size of a wide reference area in the chip area based on a range in which the wide-range process proximity effects extend; and
   a mask data generator configured to generate mask data by applying the wide correction data to the wide correction area and the basic correction data to the plurality of blocks other than the wide correction area,
   wherein the wide-correction data generator generates the wide correction data with reference to a wide mask pattern correction data in consideration of the wide-range process proximity effects in the wide reference area,
   wherein the basic reference area is set such that a distance from a center of the basic reference area to an outer circumference of the basic reference area is equal to or longer than a minimum distance where the process proximity effects in the basic reference area do not reach, and
   wherein the mask data generator replaces the basic correction data of an area that overlaps the wide correction area where the wide correction data is generated, with the wide correction data.

2. The system of claim 1, further comprising a pattern measurement unit configured to measure a shape of a pattern formed on a wafer.

3. A computer implemented method for generating mask data, comprising:
   dividing, by using a computer, design data into a plurality of blocks on a chip area;
   extracting a block necessary to apply a correction for wide-range process proximity effects as a wide correction area from the plurality of blocks by comparing at least one parameter selected from the group consisting of a wafer pattern density, a mask pattern density, an optical density and mask pattern circumference lengths, which influences the wide-range process proximity effects, of each mask pattern in the blocks with an extraction condition;
   generating wide correction data to make the correction applied to the wide correction area;
   setting a basic reference area to include a plurality of patterns which optically influence each other, the sizes of the blocks being larger than the size of the basic reference area and the size of the basic reference area being narrower than an influence range of the wide-range process proximity effects;
   generating basic correction data by making the process proximity correction with reference to basic mask pattern correction data calculated in consideration of process proximity effects in the basic reference area; and
   generating mask data by applying the wide correction data to the wide correction area and applying the basic correction data to the plurality of blocks other than the wide correction area,
   wherein the wide correction data is generated with reference to wide mask pattern correction data in consideration of the wide-range process proximity effects in a wide reference area, a size of the wide reference area in the chip area being set based on a range in which the wide-range process proximity effects extend,
   wherein the basic reference area is set such that a distance from a center of the basic reference area to an outer circumference of the basic reference area is equal to or longer than a minimum distance where the process proximity effects in the basic reference area do not reach, and
   wherein the basic correction data of an area that overlaps the wide correction area where the wide correction data is generated, is replaced with the wide correction data.

4. The method of claim 3, wherein weights are assigned to the parameter by the pattern density.

5. The method of claim 3, wherein the wide reference area is set based on an amount of change in shape of an investigation pattern manufactured on a wafer compared to a desired pattern of the investigation pattern.

6. The method of claim 3, wherein the wide mask pattern correction data is calculated based on a measurement value of a pattern manufactured on a wafer by use of the mask data.

7. The method of claim 3, wherein the basic reference area is set based on optical conditions of exposure equipment to which an exposure mask is attached, based on the mask data.

8. The method of claim 7, wherein the optical conditions include an exposure wavelength, a numerical aperture of a projection optical system of the exposure equipment and a coherence factor.

9. The method of claim 3, wherein the mask data is generated while replacing the basic correction data of an area that overlaps the wide correction area where the wide correction data is generated, with the wide correction data.

10. The method of claim 3, wherein the mask data is generated by generating synthetic correction data, in which the basic correction data of an area that overlaps the wide correction area where the wide correction data is generated, is all replaced with the wide correction data.

11. An exposure mask produced with mask data, the mask data being generated by a method comprising:
    dividing, by using a computer, design data into a plurality of blocks on a chip area;
    extracting a block necessary to apply a correction for wide-range process proximity effects as a wide correction area from the plurality of blocks by comparing at least one parameter selected from the group consisting of a wafer pattern density, a mask pattern density, an optical density and mask pattern circumference lengths, which influences the wide-range process proximity effects, of each mask pattern in the blocks with an extraction condition;

generating wide correction data to make the correction applied to the wide correction area;

setting a basic reference area to include a plurality of patterns which optically influence each other, the sizes of the blocks being larger than the size of the basic reference area and the size of the basic reference area being narrower than an influence range of the wide-range process proximity effects;

generating basic correction data by making the process proximity correction with reference to basic mask pattern correction data calculated in consideration of process proximity effects in the basic reference area; and applying the wide correction data to the wide correction area and the basic correction data to the plurality of blocks other than the wide correction area, wherein the wide correction data is generated with reference to wide mask pattern correction data in consideration of the wide-range process proximity effects in a wide reference area, a size of the wide reference area in the chip area being set based on a range in which the wide-range process proximity effects extend, wherein the basic reference area is set such that a distance from a center of the basic reference area to an outer circumference of the basic reference area is equal to or longer than a minimum distance where the process proximity effects in the basic reference area do not reach, and wherein the basic correction data of an area that overlaps the wide correction area where the wide correction data is generated, is replaced with the wide correction data.

12. A method including a photolithography process using an exposure mask for manufacturing a semiconductor device, comprising:

generating mask data, comprising:

dividing, by using a computer, design data into a plurality of blocks on a chip area;

extracting a block necessary to apply a correction for wide-range process proximity effects as a wide correction area from the plurality of blocks by comparing at least one parameter selected from the group consisting of a wafer pattern density, a mask pattern density, an optical density and mask pattern circumference lengths, which influences the wide-range process proximity effects, of each mask pattern in the blocks with an extraction condition;

generating wide correction data to make the correction applied to the wide correction area;

setting a basic reference area to include a plurality of patterns which optically influence each other, the sizes of the blocks being larger than the size of the basic reference area and the size of the basic reference area being narrower than an influence range of the wide-range process proximity effects;

generating basic correction data by making the process proximity correction with reference to basic mask pattern correction data calculated in consideration of process proximity effects in the basic reference area; and generating the mask data by applying the wide correction data to the wide correction area and the basic correction data to the plurality of blocks other than the wide correction area;

preparing the exposure mask based on the mask data; and performing the photolithography process using the exposure mask, wherein the wide correction data is generated with reference to wide mask pattern correction data in consideration of the wide-range process proximity effects in a wide reference area, a size of the wide reference area in the chip area being set based on a range in which the wide-range process proximity effects extend, wherein the basic reference area is set such that a distance from a center of the basic reference area to an outer circumference of the basic reference area is equal to or longer than a minimum distance where the process proximity effects in the basic reference area do not reach, and wherein the basic correction data of an area that overlaps the wide correction area where the wide correction data is generated, is replaced with the wide correction data.

13. A computer-readable medium containing a computer program product to be executed by a computer for generating mask data, comprising:

instructions configured to divide design data into a plurality of blocks on a chip area;

instructions configured to extract a block necessary to apply a correction for wide-range process proximity effects as a wide correction area from the plurality of blocks by comparing at least one parameter selected from the group consisting of a wafer pattern density, a mask pattern density, an optical density and mask pattern circumference lengths, which influences the wide-range process proximity effects, of each mask pattern in the blocks with an extraction condition;

instructions configured to generate wide correction data to make the correction applied to the wide correction area;

instructions configured to set a basic reference area to include a plurality of patterns which optically influence each other, the sizes of the blocks being larger than the size of the basic reference area and the size of the basic reference area being narrower than an influence range of the wide-range process proximity effects;

instructions configured to generate basic correction data by making the process proximity correction with reference to basic mask pattern correction data calculated in consideration of process proximity effects in the basic reference area; and instructions configured to generate mask data by applying the wide correction data to the wide correction area and the basic correction data to the plurality of blocks other than the wide correction area, wherein the wide correction data is generated with reference to wide mask pattern correction data in consideration of the wide-range process proximity effects in a wide reference area, a size of the wide reference area in the chip area being set based on a range in which the wide-range process proximity effects extend, wherein the basic reference area is set such that a distance from a center of the basic reference area to an outer circumference of the basic reference area is equal to or longer than a minimum distance where the process proximity effects in the basic reference area do not reach, and wherein the basic correction data of an area that overlaps the wide correction area where the wide correction data is generated, is replaced with the wide correction data.

14. A computer implemented method for generating mask data, comprising:

setting, by using a computer, a basic reference area of design data to include a plurality of patterns which optically influence each other;

generating basic correction data by making process proximity correction with reference to basic mask pattern correction data calculated in consideration of process proximity effects in the basic reference area;

generating corrected design data by applying the basic correction data to the design data;

dividing the corrected design data into a plurality of blocks, the sizes of the blocks being larger than the size of the basic reference area and the size of the basic reference area being narrower than an influence range of wide-range process proximity effects;

extracting a block necessary to apply a correction for the wide-range process proximity effects as a wide correction area from the plurality of blocks by comparing at least one parameter selected from the group consisting of a wafer pattern density, a mask pattern density, an optical density and mask pattern circumference lengths, which influences the wide-range process proximity effects, of each mask pattern in the plurality of blocks with an extraction condition;

generating wide correction data to make the correction applied to the wide correction area; and generating mask data by applying the wide correction data to the wide correction area and applying the basic correction data to the plurality of blocks other than the wide correction area, wherein the wide correction data is generated with reference to wide mask pattern correction data in consideration of the wide-range process proximity effects in a wide reference area, a size of the wide reference area being set based on a range in which the wide-range process proximity effects extend, and wherein the basic reference area is set such that a distance from a center of the basic reference area to an outer circumference of the basic reference area is equal to or longer than a minimum distance where the process proximity effects in the basic reference area do not reach.

15. A computer program product including a program stored in a computer-readable storage medium to be executed by a computer for generating mask data, the program comprising:

instructions configured to set a basic reference area of design data to include a plurality of patterns which optically influence each other;

instructions configured to generate basic correction data by making process proximity correction with reference to basic mask pattern correction data calculated in consideration of process proximity effects in the basic reference area;

instructions configured to generate corrected design data by applying the basic correction data to the design data;

instructions configured to divide the corrected design data into a plurality of blocks, the sizes of the blocks being larger than the size of the basic reference area and the size of the basic reference area being narrower than an influence range of wide-range process proximity effects;

instructions configured to extract a block necessary to apply a correction for the wide-range process proximity effects as a wide correction area from the plurality of blocks by comparing at least one parameter selected from the group consisting of a wafer pattern density, a mask pattern density, an optical density and mask pattern circumference lengths, which influences the wide-range process proximity effects, of each mask pattern in the plurality of blocks with an extraction condition;

instructions configured to generate wide correction data to make the correction applied to the wide correction area; and instructions configured to generate mask data by applying the wide correction data to the wide correction area and applying the basic correction data to the plurality of blocks other than the wide correction area, wherein the wide correction data is generated with reference to wide mask pattern correction data in consideration of the wide-range process proximity effects in a wide reference area, a size of the wide reference area being set based on a range in which the wide-range process proximity effects extend, and wherein the basic reference area is set such that a distance from a center of the basic reference area to an outer circumference of the basic reference area is equal to or longer than a minimum distance where the process proximity effects in the basic reference area do not reach.

* * * * *